(12) United States Patent
Morikawa et al.

(10) Patent No.: US 10,128,138 B2
(45) Date of Patent: Nov. 13, 2018

(54) SUBSTRATE TRANSFER METHOD AND STORAGE MEDIUM

(71) Applicant: Tokyo Electron Limited, Tokyo (JP)

(72) Inventors: Katsuhiro Morikawa, Koshi (JP); Ikuo Sunaka, Koshi (JP); Seiji Nakano, Koshi (JP); Kazunori Kuratomi, Koshi (JP); Toshio Shimazu, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/448,882

(22) Filed: Mar. 3, 2017

(65) Prior Publication Data
US 2017/0178935 A1    Jun. 22, 2017

Related U.S. Application Data

(62) Division of application No. 14/135,988, filed on Dec. 20, 2013, now Pat. No. 9,627,238.

(30) Foreign Application Priority Data

Dec. 25, 2012 (JP) .................................. 2012-281588
Jul. 23, 2013 (JP) .................................. 2013-152765

(51) Int. Cl.
*H01L 21/67* (2006.01)
*H01L 21/677* (2006.01)

(52) U.S. Cl.
CPC .. *H01L 21/67265* (2013.01); *H01L 21/67772* (2013.01); *H01L 21/67778* (2013.01); *B65G 2201/0297* (2013.01)

(58) Field of Classification Search
CPC .......................... H01L 21/67265; H01L 21/67
See application file for complete search history.

(56) References Cited

U.S. PATENT DOCUMENTS

| 5,645,391 | A | 7/1997 | Ohsawa |
| 5,906,469 | A * | 5/1999 | Oka ................. H01L 21/67265 414/416.08 |
| 6,082,949 | A | 7/2000 | Rosenquist |
| 6,419,439 | B2 | 7/2002 | Schlehahn |
| 2003/0012625 | A1 | 1/2003 | Rosenquist |
| 2006/0236793 | A1 | 10/2006 | Hunter |

(Continued)

FOREIGN PATENT DOCUMENTS

| JP | 04-010639 A | 1/1992 |
| JP | H09-134944 A | 5/1997 |

(Continued)

*Primary Examiner* — Mark C Hageman
(74) *Attorney, Agent, or Firm* — Pearne & Gordon LLP

(57) ABSTRACT

A substrate transfer method is provided. The substrate transfer method comprises: loading the transfer container to a load port, and separating the cover body from the container main body; detecting an accommodation status of the substrate in the container main body by a detection unit; correcting, by a correction device, the accommodation status of the substrate in the container main body in which the accommodation status of the substrate detected by the detection unit is abnormal; and allowing a substrate transfer device to enter the container main body in which the accommodation status of the substrate is corrected, and unloading the substrate from the container main body.

5 Claims, 28 Drawing Sheets

(56) References Cited

U.S. PATENT DOCUMENTS

| | | |
|---|---|---|
| 2007/0009345 A1 | 1/2007 | Hall |
| 2008/0206028 A1 | 8/2008 | Nagata |
| 2010/0094452 A1 | 4/2010 | Ogi |
| 2012/0100709 A1 | 4/2012 | Minami |
| 2015/0056043 A1 | 2/2015 | Hankes |

FOREIGN PATENT DOCUMENTS

| | | |
|---|---|---|
| JP | 11-011663 A | 1/1999 |
| JP | 11-204612 A | 7/1999 |
| JP | 2003-092341 A | 3/2003 |
| JP | 2010-219209 A | 9/2010 |

* cited by examiner

SUBSTRATE TRANSFER METHOD AND STORAGE MEDIUM

CROSS-REFERENCE TO RELATED APPLICATION

This is a divisional application of U.S. patent application Ser. No. 14/135,988, filed on Dec. 20, 2013 which claims the benefit of Japanese Patent Application No. 2012-281588 filed on Dec. 25, 2012 and Japanese Patent Application No. 2013-152765 filed on Jul. 23, 2013, the disclosures of which are incorporated herein by reference.

TECHNICAL FIELD

The embodiments described herein pertain generally to a technology for unloading a substrate from a transfer container in a substrate processing apparatus.

BACKGROUND

In a semiconductor manufacturing factory, a semiconductor substrate is accommodated in a transfer container, and the transfer container is transferred to a semiconductor manufacturing apparatus by an automated guided vehicle (AGV) or an overhead transfer device (OHT). The semiconductor manufacturing apparatus includes a loading/unloading port for loading/unloading the semiconductor into/from the transfer container from/into the apparatus and a processing block for performing a process onto the semiconductor substrate (wafer). The transfer container is configured as an airtight container including a cover body at a front surface of a container main body. At an outer surface of the cover body, two key holes for separating the cover body from the container main body are formed. Within the container main body, multiple sheets of the wafer are stored in the form of shelves.

The loading/unloading port is typically called a "load port", and includes a stage on which the transfer container is mounted from the outside and a device configured to separate the cover body. The semiconductor manufacturing apparatus includes a film forming apparatus, a mask pattern forming apparatus, an etching apparatus, and a cleaning apparatus to be appropriately used for respective processes of a semiconductor manufacturing process. The semiconductor substrate is transferred between these apparatuses in sequence by the transfer container.

Typically, in the transfer container, the wafer is stored horizontally. However, as described below, when the cover body is separated, the wafer may be inclined within the container main body. In this case, the wafer may be damaged by a wafer moving and mounting device when the wafer moving and mounting device enters into the transfer container. Further, when the cover body is separated, the wafer may be protruded from the container main body. In this case, the substrate may not be transferred by the wafer moving and mounting device to a preset target position, or the wafer may fall down from the moving and mounting device. Patent Document 1 describes that a positioning error correction member is provided at a moving and mounting device. However, it requires high costs to provide the correction member as such, and there is no consideration on inclination of a substrate. Thus, it is not sufficient to solve the above-described problem. Further, Patent Document 2 describes a technology of detecting a protrusion of a substrate from a transfer container and stopping an unloading of the substrate when the protrusion is detected. However, if the unloading is stopped as such, production efficiency of a semiconductor device is decreased.

Patent Document 1: Japanese Patent Laid-open Publication No. H11-011663

Patent Document 2: Japanese Patent Laid-open Publication No. H04-010639

SUMMARY

In view of the foregoing problems, example embodiments provide a technology capable of avoiding damage to a substrate or a transfer error when the substrate is unloaded from a transfer container configured to accommodate the substrate and load the substrate into a substrate processing apparatus.

In one example embodiment, a substrate transfer apparatus that unloads a substrate from a transfer container in which a cover body airtightly closes a substrate unloading opening formed at a front surface of a container main body and multiple substrates are accommodated in the form of shelves includes a load port to which the transfer container is loaded; a detection unit configured to detect an accommodation status of the substrate in the container main body that is loaded to the load port and separated from the cover body; a substrate transfer device configured to enter the container main body and unload the substrate; and a correction device configured to correct the accommodation status of the substrate in the container main body before the substrate is unloaded from the container main body by the substrate transfer device when the detection unit detects abnormality in the accommodation status.

In another example embodiment, a substrate transfer method of unloading a substrate from a transfer container in which a cover body airtightly closes a substrate unloading opening formed at a front surface of a container main body and multiple substrates are accommodated in the form of shelves includes loading the transfer container to a load port, and separating the cover body from the container main body; detecting an accommodation status of the substrate in the container main body by a detection unit; correcting, by a correction device, the accommodation status of the substrate in the container main body in which the accommodation status of the substrate detected by the detection unit is abnormal; and allowing a substrate transfer device to enter the container main body in which the accommodation status of the substrate is corrected, and unloading the substrate from the container main body.

In still another example embodiment, a computer-readable storage medium having stored thereon computer-executable instructions that, in response to execution, cause a substrate transfer apparatus to perform a substrate transfer method as described above.

In accordance with the example embodiments, before a substrate is unloaded from a transfer container loaded to a load port by a substrate transfer device and after a cover body of the transfer container is opened, a detection unit detects an accommodation status of the substrate. When the detection unit detects abnormality in the accommodation status, the accommodation status is corrected by a correction device. Thus, it is possible to avoid damage to the substrate or a transfer error when the substrate is unloaded from the transfer container. The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
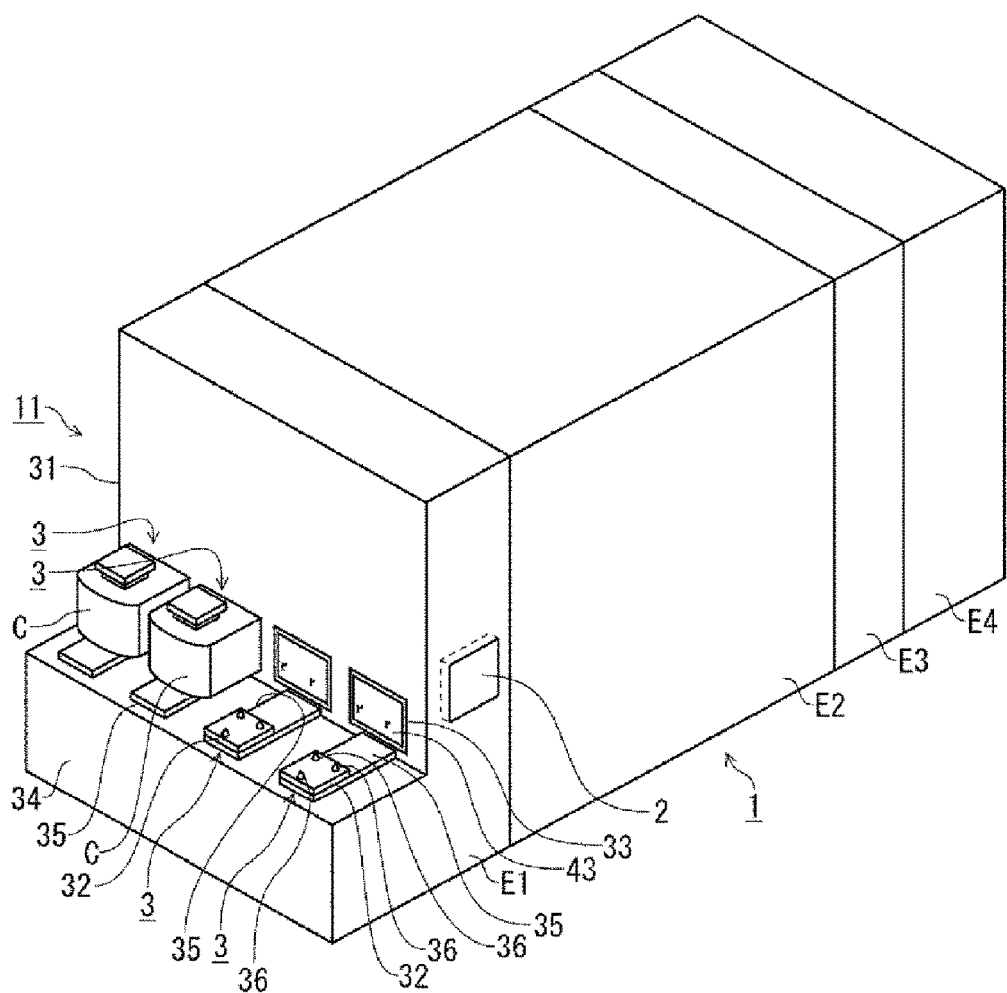
FIG. 1 is a perspective view of a coating and developing apparatus as a substrate processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example. Still, the examples described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A coating and developing apparatus 1 serving as a substrate processing apparatus of an example embodiment will be explained with reference to FIG. 1. FIG. 1 is a perspective view of the coating and developing apparatus 1. The coating and developing apparatus 1 is provided at a clean room in a semiconductor manufacturing factory, and includes a carrier block E1, a processing block E2, and an interface block E3 linearly connected to each other. The interface block E3 is connected to an exposure apparatus E4 opposite to the processing block E2. The outside of the coating and developing apparatus 1 is a transfer region 11 of a carrier C. The carrier C is a transfer container accommodating multiple sheets of wafer W as substrates each having a diameter of, for example, about 450 mm in the form of shelves, and is transferred to the transfer region 11 by a non-illustrated carrier transfer device.

An operation of each block will be explained briefly. The carrier block E1 is configured to transfer the carrier C with respect to the carrier transfer device. Further, the carrier block E1 transfers the wafer W between the carrier C transferred into the carrier block E1 and the processing block E2. The carrier block E1 will be explained in detail below.

The processing block E2 is configured to perform various liquid processes such as a resist coating process, a developing process, and the like on the wafer W or perform a heating process. The exposure apparatus E4 is configured to expose a resist film formed on the wafer W in the processing block E2. The interface block E3 is configured to transfer the wafer W between the processing block E2 and the exposure apparatus E4. After a resist coating process and a heating process are performed on the wafer W unloaded from the carrier C in sequence within the processing block E2, the wafer W is exposed within the exposure apparatus E4. Then, after a heating process and a developing process are performed on the wafer W in sequence within the processing block E2, and the wafer W is returned back to the carrier C.

By way of example, at a side surface of the carrier block E1, an apparatus controller 2 for controlling operations of the respective components of the coating and developing apparatus 1 is provided. The apparatus controller 2 is a computer and transmits a control signal to the respective components of the coating and developing apparatus 1. The carrier block E1 receives this control signal and is controlled to load the wafer W into the carrier block E1 and unload the wafer W from the carrier block E1, which will be described below. Further, when the respective blocks E1 to E3 receive this control signal, they are controlled to transfer the wafer W between these blocks and perform the processes on the wafer W as described above.

Hereinafter, the carrier block E1 will be explained in detail with reference to the longitudinal side views of FIG. 2 and FIG. 3. For convenience of explanation, the carrier block E1's side and the interface block E3's side are explained as a back side and a front side, respectively. The carrier block E1 includes a housing 31, and the housing 31 transfers the carrier C with respect to the carrier transfer device and constitutes a load port 3 configured to transfer the wafer W between the carrier C and the coating and developing apparatus 1.

The load port 3 includes a stage 32 configured to mount the carrier C thereon, a transfer opening 33 of the wafer W, an opening/closing door 4 configured to open and close the transfer opening 33, and a mapping unit 5 in addition to the housing 31. A lower part of the housing 31 protrudes toward the back side to form a step-shaped portion 34. On the step-shaped portion 34, the stages 32 of the respective load ports 3 are arranged transversely. At a wall surface of the housing 31 on the back side as viewed from each stage 32, the transfer opening 33 is opened.

The stage 32 is configured to be moved backward and forward, and move the carrier C from a retreat position (unload position) and an advance position (load position). FIG. 2 illustrates the carrier C positioned at the unload position by a dashed dotted line, and FIG. 3 illustrates the carrier C positioned at the load position. The carrier C is transferred to the unload position by the carrier transfer device. Further, at the load position, the wafer W is transferred to the carrier block E1. The stage 32 is connected to a stage moving device 35, and the above-described forward and backward movements are carried out by the stage moving device 35.

Three pins 36 protrude upwards from a surface of the stage 32. When the carrier C is mounted on the stage 32, these pins 36 are fitted into recesses (illustration omitted) formed at a lower side of the carrier C and suppress misalignment of the carrier C on the stage 32.

Figure 4:
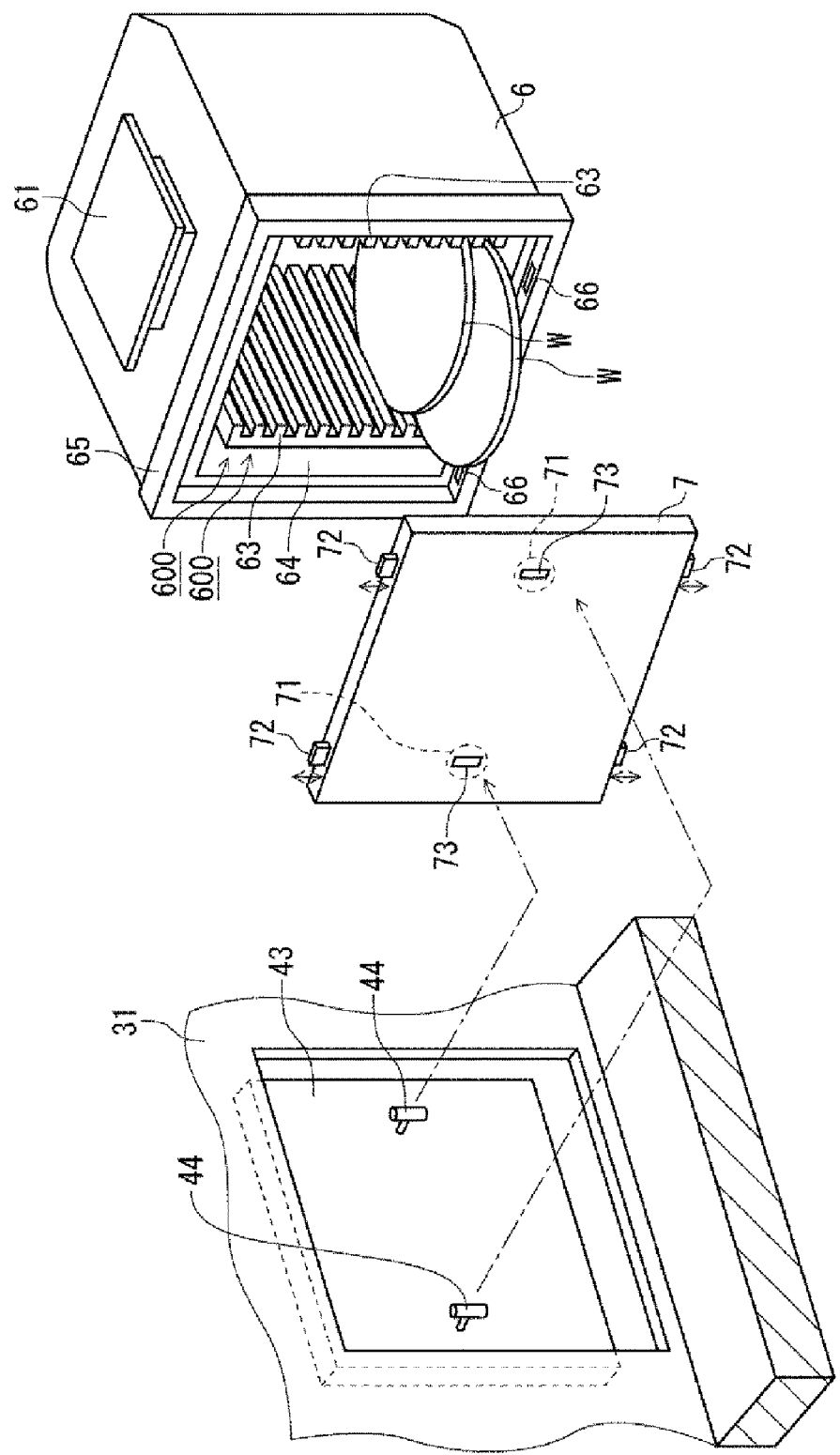
FIG. 4 is a perspective view of an opening/closing door and a carrier of the carrier block.
Figure 5:
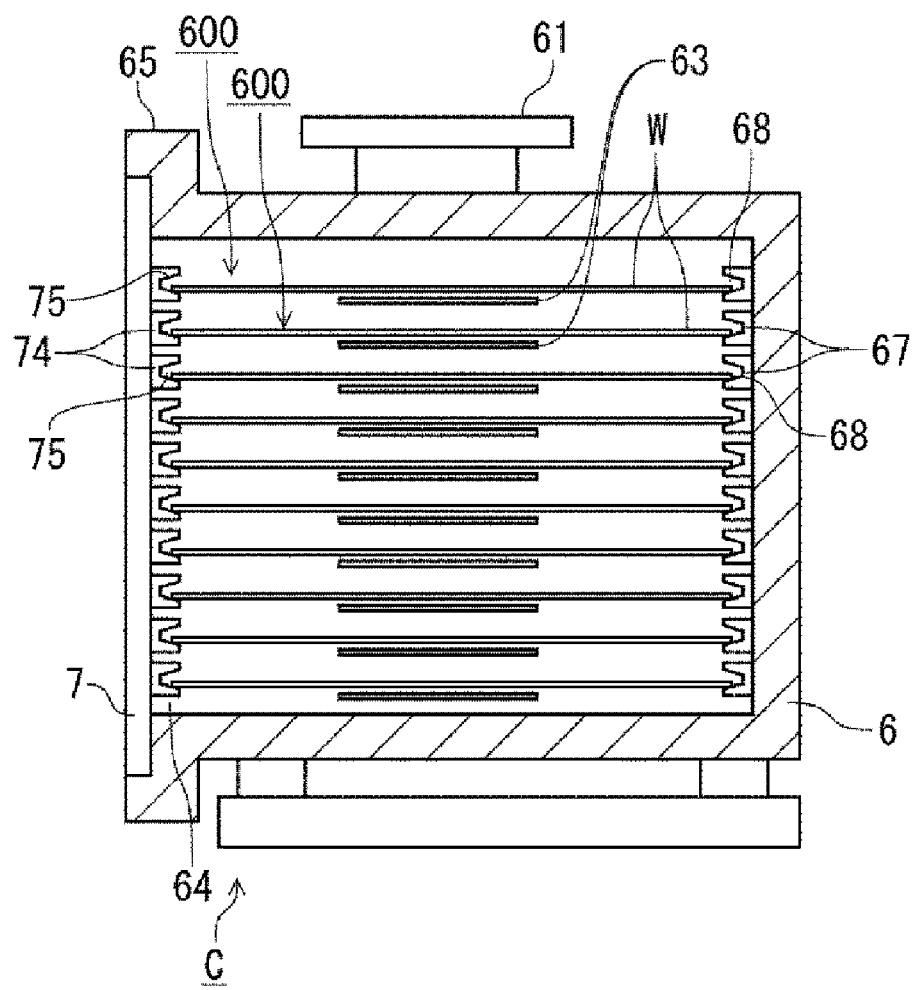
FIG. 5 is a longitudinal side view of the carrier.

Hereinafter, the carrier C will be explained with reference to the perspective view of FIG. 4 and the longitudinal side view of FIG. 5. The carrier C includes a container main body 6 and a cover body 7 detachable attached to the container main body 6. On the right and left sides of the container main body 6, supporting members 63 configured to support a periphery portion of a rear surface of the wafer W are provided at multiple levels, and the wafers W are accommodated in the container main body 6 in the form of shelves. Regions above the respective supporting members 63 serve as slots 600 for storing the wafers W, and for example, 25 slots 600 are provided (fewer than 25 slots are illustrated in the drawing for convenience). In some cases, the respective slots 600 may be denoted by reference numerals 601, 602, 603, . . . , 625 in sequence from the lowermost one to the uppermost one to identify each slot.

At a front surface of the container main body 6, an unloading opening 64 of the wafer W is formed. Since the unloading opening 64 is closed by the cover body 70, an inside of the container main body 6 is maintained airtightly. In the drawing, a reference numeral 65 denotes an opening peripheral portion around the unloading opening 64. At inner peripheral upper and lower sides of the opening peripheral portion 65, engagement grooves 66 are formed (illustration of the upper engagement grooves 66 are omitted). A grip portion 61 is provided on the container main body 6, and the carrier transfer device grips the grip portion 61 to transfer the carrier C.

At the inner back side of the container main body 6, holders 67 of the wafer W are provided at the respective slots 600. At the holder 67, there is formed a notched groove 68 that allows a periphery portion of the wafer W to enter. A width of the notched groove 68 is increased toward the front side of the container main body 6, and an upper surface and a lower surface of the notched groove 68 are inclined.

The cover body 7 will be explained. On the right and left sides within the cover body 7, rotating parts 71 are provided. Moving parts 72 extended vertically are provided above and below the rotating part 71. The moving parts 72 are switched between a state where a leading ends thereof protrude from a top surface and a bottom surface of the cover body 7 and a state where the leading ends thereof get into the cover body 7 by rotation of the rotating part 71. The leading ends of the moving parts 72 are engaged with the engagement grooves 66 of the container main body 6, so that the cover body 7 is engaged with the container main body 6 to be in a locked state. At the rotating part 71, there is formed a key hole 73 into which a latch key 44 to be described later is inserted. By rotating the latch key 44 inserted into the key hole 73, the rotating part 71 is rotated.

Figure 6:
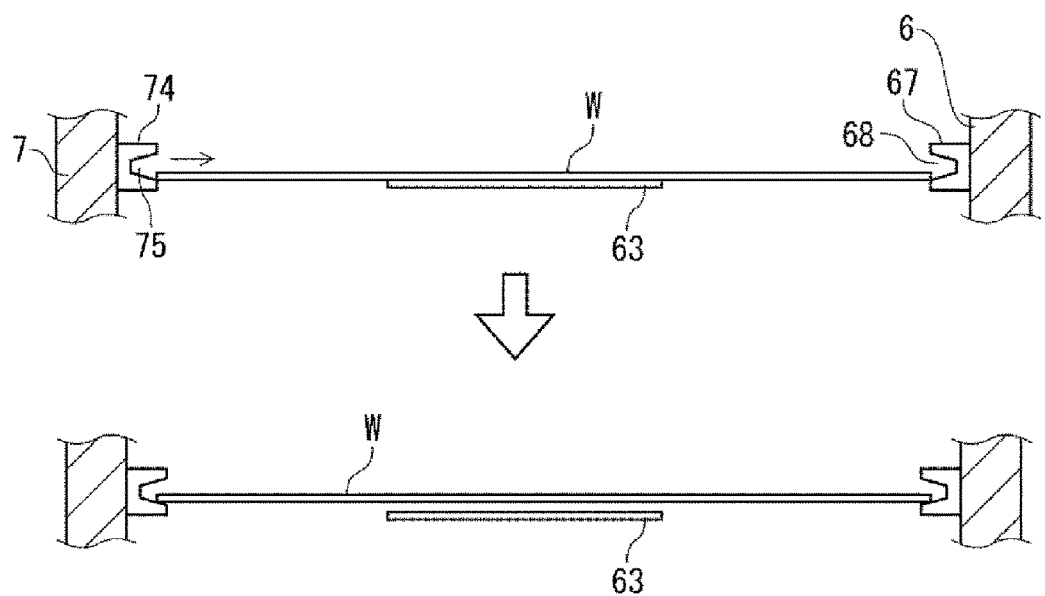
FIG. 6 is an explanatory diagram illustrating an accommodation status of a wafer in the carrier.

At a rear surface side of the cover body 7, holders 74 are provided at the respective slots 600. At the holder 74, a notched groove 75 is formed to face the notched groove 68 of the holder 67. Further, a width of the notched groove 75 is increased toward the inner back side of the container main body 6, and an upper surface and a lower surface of the notched groove 75 are inclined. If the cover body 7 is closed when the wafer W is stored in the container main body 6, the cover body 7 is moved toward the container main body 6 while the wafer W is supported by the supporting member 63 as schematically depicted in FIG. 6. Thus, the periphery portion of the wafer W enters the notched groove 75 of the holder 74 and the wafer W is pushed by the cover body 7. Therefore, the periphery portion of the wafer W also enters the notched groove 68 of the holder 67 of the container main body 6. Then, when the cover body 7 is further moved, the periphery portion of the wafer W goes up along the inclined surfaces of the notched grooves 68 and 75 to be supported while being apart from the supporting member 63.

Hereinafter, the opening/closing door 4 will be explained. The opening/closing door 4 includes a door main body 40 configured to close the transfer opening 33 from an inside of the housing 31. In FIG. 3, a position where the transfer opening 33 is closed by the door main body 40 is indicated by a solid line, and this position is referred to as a "closing position". The door main body 40 is connected to a door opening/closing device 41. When the transfer opening 33 is opened, the door main body 40 is moved toward a separation position forwardly apart from the closing position by the door opening/closing device 41. Further, the door main body 40 is moved downwardly to an opening position indicated by a dashed dotted line in FIG. 3 from the separation position by the door opening/closing device 41, so that the transfer opening 33 is opened.

Figure 2:
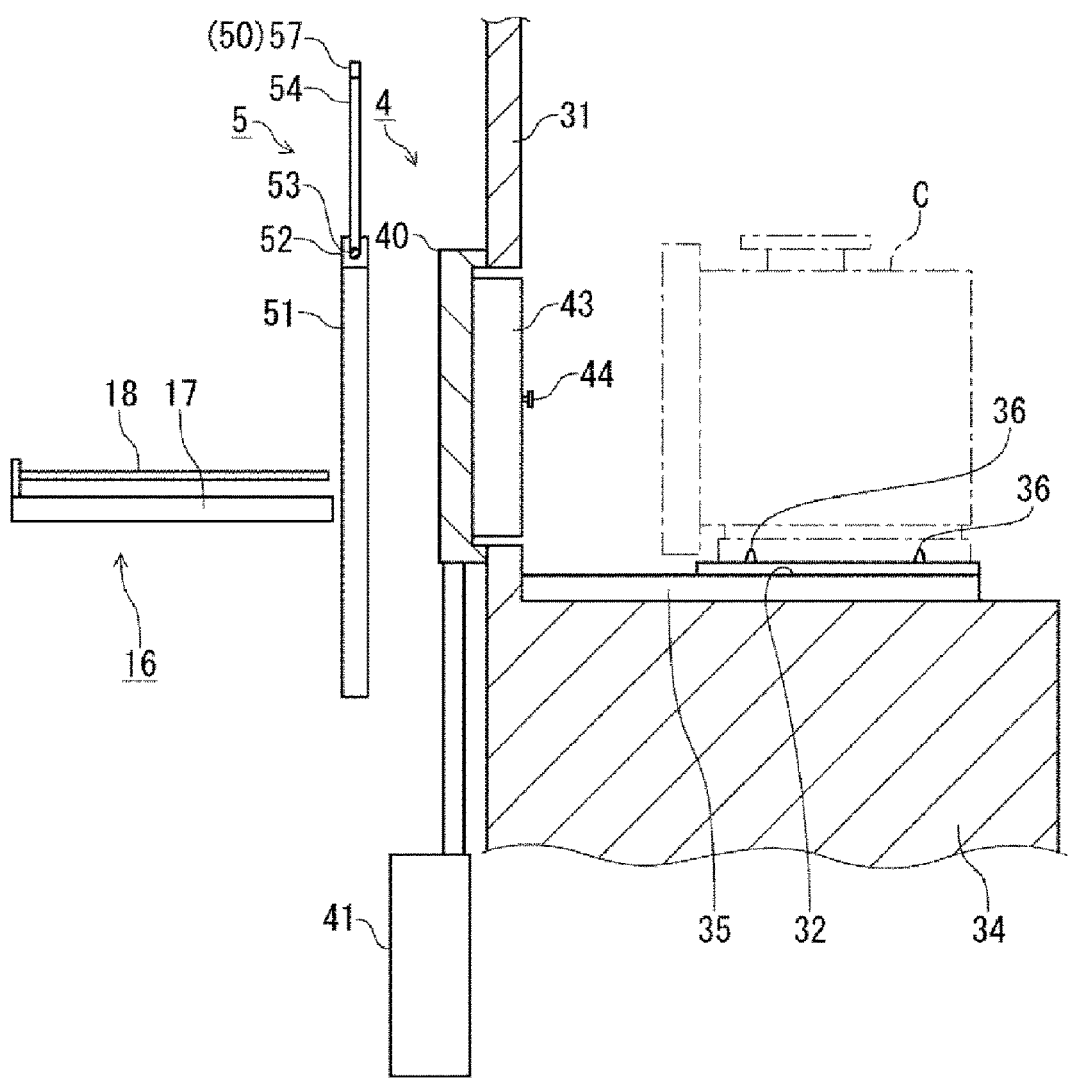
FIG. 2 is a side view of a carrier block of the coating and developing apparatus.

As depicted in FIG. 2, within the housing 31, there is provided a moving and mounting device 16 commonly shared by the respective load ports 2. The moving and mounting device 16 includes a base 17 configured to be movable in vertical, right and left directions, and rotatable around a vertical axis; and a fork 18 as a wafer holder that is disposed horizontally and configured to move back and forth on the base 17. The wafer W can be transferred between the carrier C and the processing block E2 through the opened transfer opening 33 by the moving and mounting device 16.

The opening/closing door 4 includes a cover body opening/closing device 43 on the back side of the door main body 40. The cover body opening/closing device 43 includes the latch key 44 on the back side thereof. The latch key 44 is rotated about a horizontal axis. When the carrier C is moved back and forth by the stage 32, the latch key 44 is inserted and withdrawn with respect to the key hole 73 of the rotating part 71 of the cover body 7.

Hereinafter, the mapping unit 5 will be explained with reference to the transversal plane view of the carrier C and the carrier block E1 of FIG. 7. The mapping unit 5 is provided within the housing 31 and serves as a unit configured to check an accommodation status of the wafer W in the carrier C. Such a check may be called "mapping process". The mapping unit 5 includes an elevation device 51, a rotation device 52, a supporting shaft 53, supporting arms 54, 54, and 55, a light transmitting unit 56, a light receiving unit 57, and a reflection sensor 58.

The rotation device 52 is vertically moved by the elevation device 51. At the rotation device 52, the supporting shaft 53 is provided to be extended horizontally. The supporting shaft 53 is configured to be rotatable about an axis by the rotation device 52. On the right and left sides of the supporting shaft 53, the supporting arms 54, 55, and 54 are provided in sequence at intervals. The supporting arms 54, 54, and 55 are extended in parallel with one another to be orthogonal to the supporting shaft 53. At leading ends of the supporting arms 54, the light transmitting unit 56 and the light receiving unit 57 serving as a pair of transmission sensors are provided. In some cases, the light transmitting unit 56 and the light receiving unit 57 may be described as a sensor pair 50. At a leading end of the supporting arm 55, the reflection sensor 58 is provided. The reflection sensor 58 and the sensor pair 50 serving as a detection unit are provided at the same height.

Figure 3:
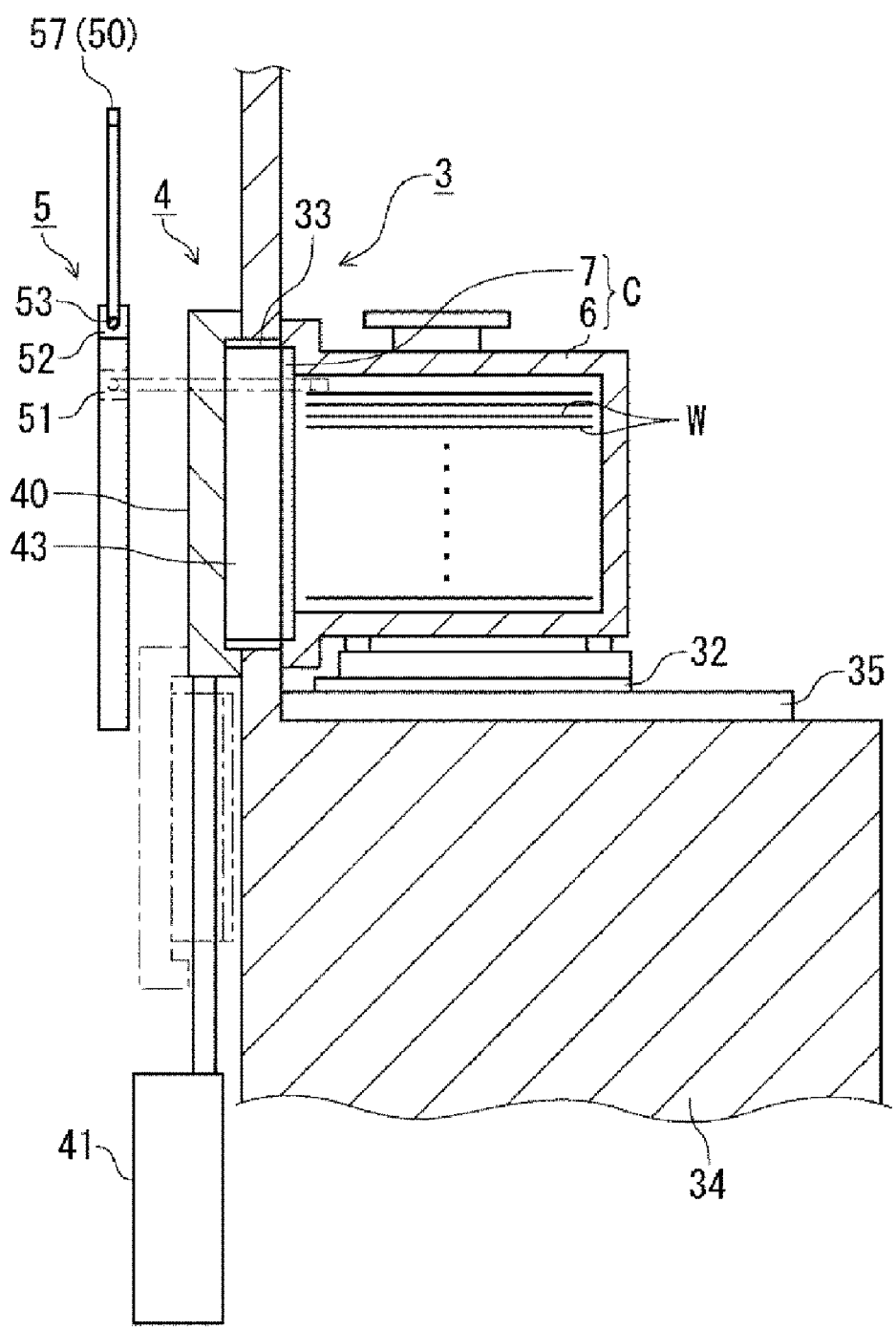
FIG. 3 is a side view of a carrier block of the coating and developing apparatus.

When the mapping process is not carried out, the supporting arms 54, 54, and 55 stand by in an upward posture as indicated by a solid line in FIG. 3. A position where the sensor pair 50 and the reflection sensor 58 stand by while being supported by the supporting arms 54, 54, and 55 is referred to as a "sensor stand-by position". When the mapping process is carried out, the arms 54, 54, and 55 are in a horizontal posture. In this case, by the combination of the elevation of the elevation device 51 and the rotation of the rotation device 52, the sensor pair 50 is moved from the sensor stand-by position to the inside of the container main body 6, from which the cover body 7 is separated, as indicated by a dashed dotted line in FIG. 3.

Figure 7:
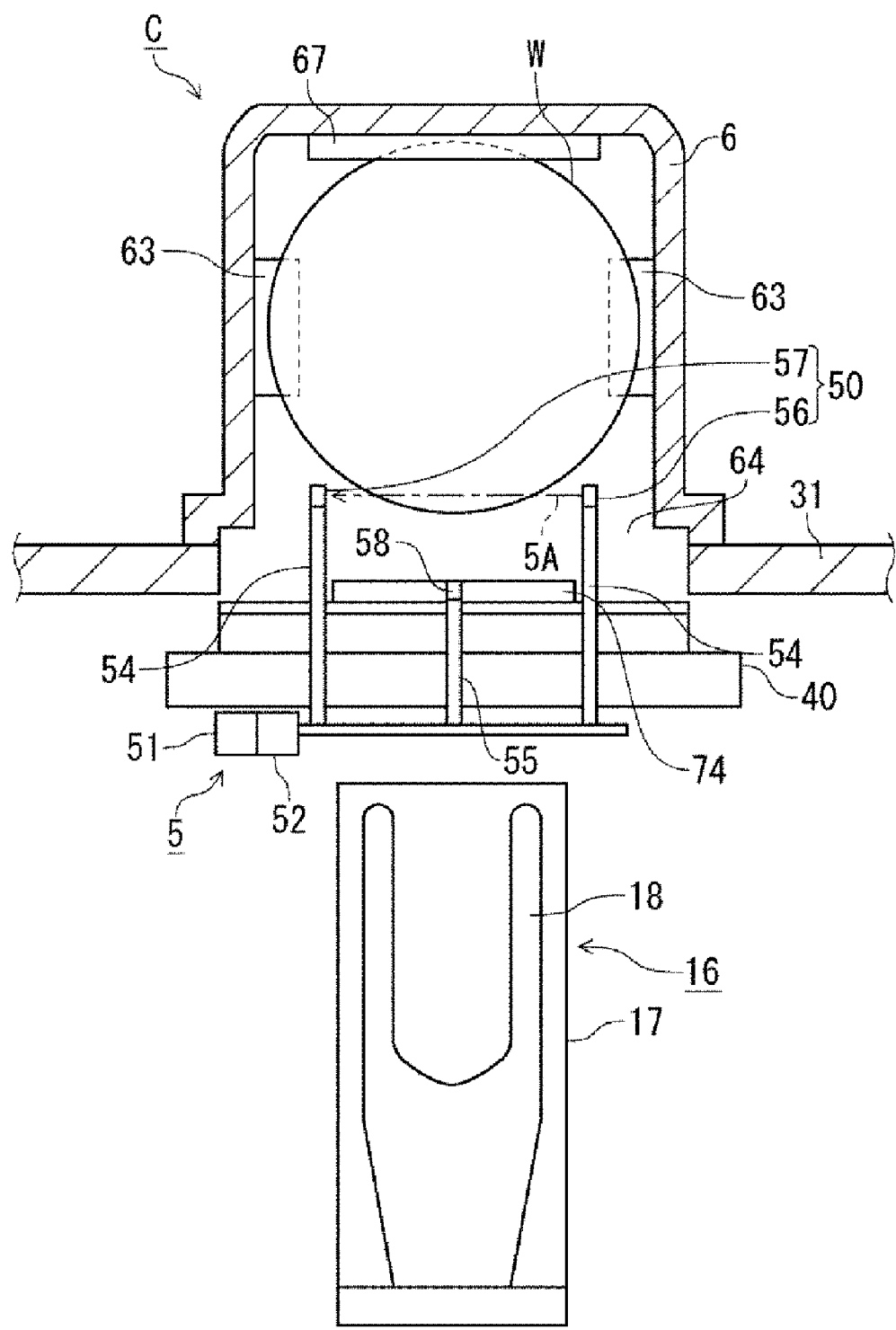
FIG. 7 is a transversal plane view of the carrier block and the carrier.

In FIG. 7, a dashed-dotted-line arrow 5A indicates an optical axis formed from the light transmitting unit 56 toward the light receiving unit 57 during the mapping process. The sensor pair 50 is provided at the supporting arms 54 such that the optical axis 5A is overlapped with the wafer W in the container main body 6. Further, during the mapping process, the reflection sensor 58 is provided at the supporting arm 55 to be located at a front side of the optical axis 5A. The reflection sensor 58 horizontally irradiates a light toward the back side (the container main body 6's side). When a light is irradiated to the wafer W, the light is reflected and incident into the reflection sensor 58. If the light receiving unit 57 receives the light of the optical axis 5A and the reflection sensor 58 receives the reflection light, a detection signal indicating that the lights are received as such is sent to the apparatus controller 2. The reflection sensor 58 may be configured as a distance sensor. A signal outputted from the reflection sensor 58 varies depending on intensity of a light received by the reflection sensor 58, i.e., a distance between the reflection sensor 58 and the wafer W.

When the mapping process is started, the sensor pair 50 and the reflection sensor 58 are positioned at a mapping start position set above the uppermost supporting member 63. Further, the optical axis 5A is formed by the sensor pair 50, and a light is irradiated from the reflection sensor 58 toward the back side. The sensor pair 50 and the reflection sensor 58 are moved toward a mapping finish position below the lowermost slot 600 at a constant speed. During the movement, if the light receiving unit 57 of the sensor pair 50 and the reflection sensor 58 receive lights, detection signals are outputted from the light receiving unit 57 and the reflection sensor 58, respectively, to the apparatus controller 2.

The apparatus controller 2 acquires various mapping data based on the detection signals from the sensor pair 50 and the reflection sensor 58. By way of example, the mapping data include presence/absence of the wafer W at each slot 600, a height position H1 of the wafer W, a front/back inclination angle θ1 of the wafer W, a depth position L1 of the wafer W, and a left/right inclination angle θ2 of the wafer W. Referring to the longitudinal front view and the longitudinal side view of the carrier C of FIG. 8 and FIG. 9, respectively, the height position H1 of the wafer W is detected by, for example, the sensor pair 50 and refers to a height from a horizontal axis H0 as a preset reference to an upper end of the wafer W. The front/back inclination angle θ1 of the wafer W is detected by the reflection sensor 58 and refers to an angle between an optical axis 5B horizontally outputted from the reflection sensor 58 and the wafer W, as viewed from the side.

Figure 8:
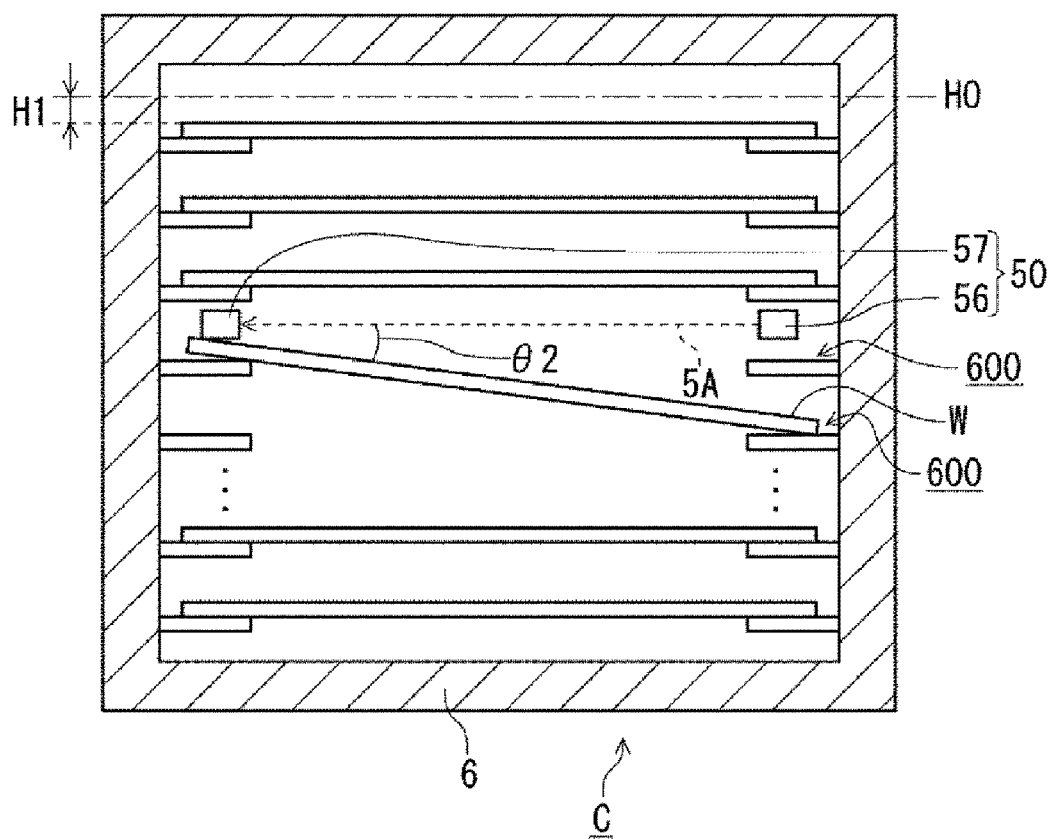
FIG. 8 is a longitudinal front view of the carrier.
Figure 9:
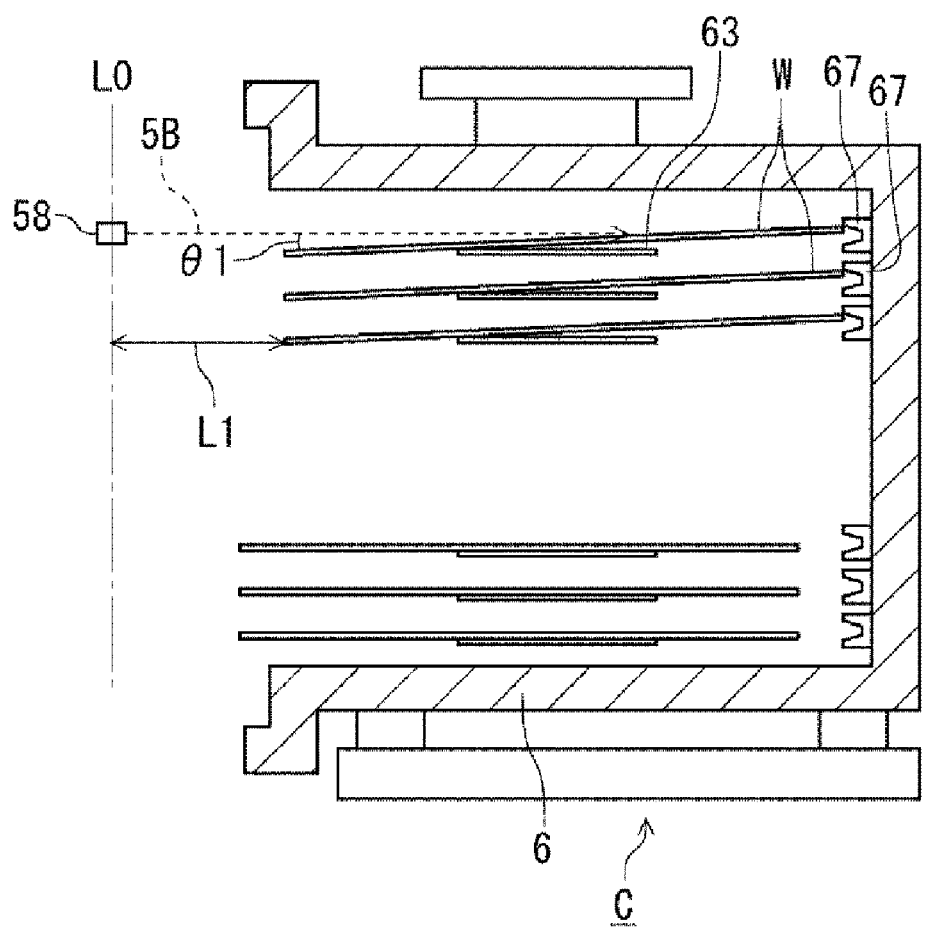
FIG. 9 is a longitudinal side view of the carrier.

The depth position L1 is detected by the reflection sensor 58 and refers to, for example, a distance from a preset vertical axis L0 as a preset reference to a front end of the wafer W. The left/right inclination angle θ2 of the wafer W is detected by the sensor pair 50 and refers to an angle between the optical axis 5A of the sensor pair 50 and the wafer W. Typically, the angle θ2 is 0°. However, as depicted in FIG. 8, if the wafer W is obliquely and abnormally stored to be supported on the multiple slots 600, the angle θ2 has a value different from 0°. Further, the apparatus controller 2 calculates a center position of each wafer W based on the front/back inclination angle θ1, the left/right inclination angle θ2, the height position H1, and the depth position L1.

Figure 10:
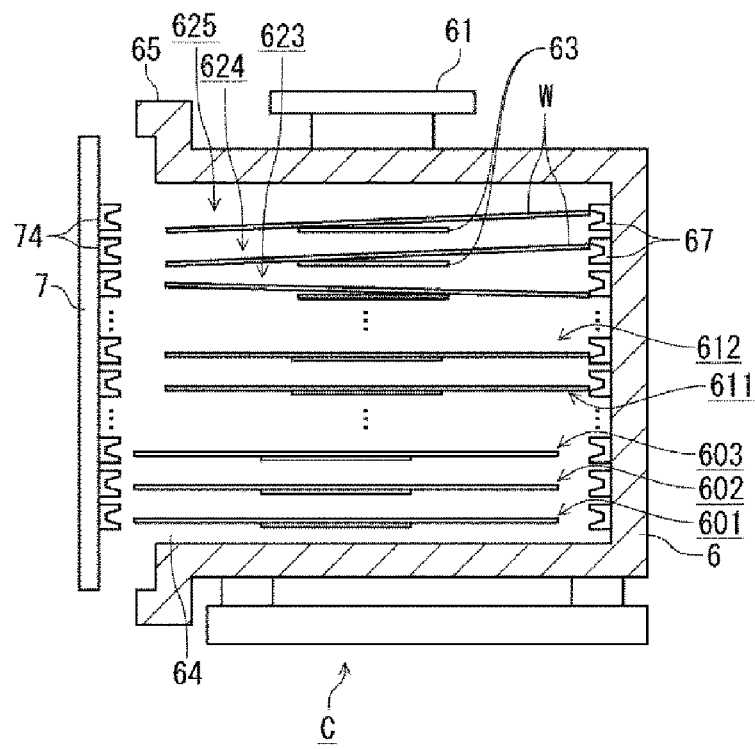
FIG. 10 is a longitudinal side view of the carrier.

A reason for acquiring the mapping data as such will be explained. When the cover body 7 closes the carrier C as described above, the front end of the wafer W is supported by the holder 74 of the cover body 7. When the cover body 7 is separated from the container main body 6 and the unloading opening 64 of the carrier C is opened, since the wafer W is supported by the holder 74 of the cover body 7, the wafer W is moved together with the cover body 7 toward the unloading opening 64. Further, when the wafer W is separated from the holder 67 of the container main body 6 and supported on the supporting member 63, the wafer W stays on the supporting member 63 due to friction with the supporting member 63 and is horizontally supported on the supporting member 63 while being separated from the holder 74. FIG. 10 illustrates the wafers W normally supported on the supporting members 63 at the slots 611 and 612.

However, when the cover body 7 is separated from the container main body 6 as described above, the wafer W may be difficult to be separated from the holder 74 due to contamination on a film of the wafer W or the carrier C, and also the wafer W being attached to the holder 74 may be moved in a relatively long distance toward the unloading opening 64. FIG. 10 illustrates the wafers W supported on the supporting members 63 at the slots 601 to 603 to be protruded from the unloading opening 64 by such a movement. Further, by way of example, the wafer W may be inclined in a forward/backward direction since an impact caused by a movement of the cover body 7 is applied to the wafer W. Also, even after the unloading opening 64 is opened, the wafer W may be disposed to be still inclined. FIG. 10 illustrates the wafers W caught by the holders 67 and disposed in an inclined state at the slots 623 to 625.

The fork 18 of the moving and mounting device 16 is moved to a preset depth in the container main body 6 when each wafer W is unloaded from the container main body 6 and transferred to the processing block E2. Therefore, if the wafer W is protruded toward the front side in the container main body 6, the fork 18 cannot receive the wafer W at the preset depth. As a result, as explained in BACKGROUND, a transfer error may occur. By way of example, the transfer error may include a case where the wafer W is not transferred appropriately to a target module in the processing block E2, or a case where the wafer W falls down from the fork 18.

Figure 11:
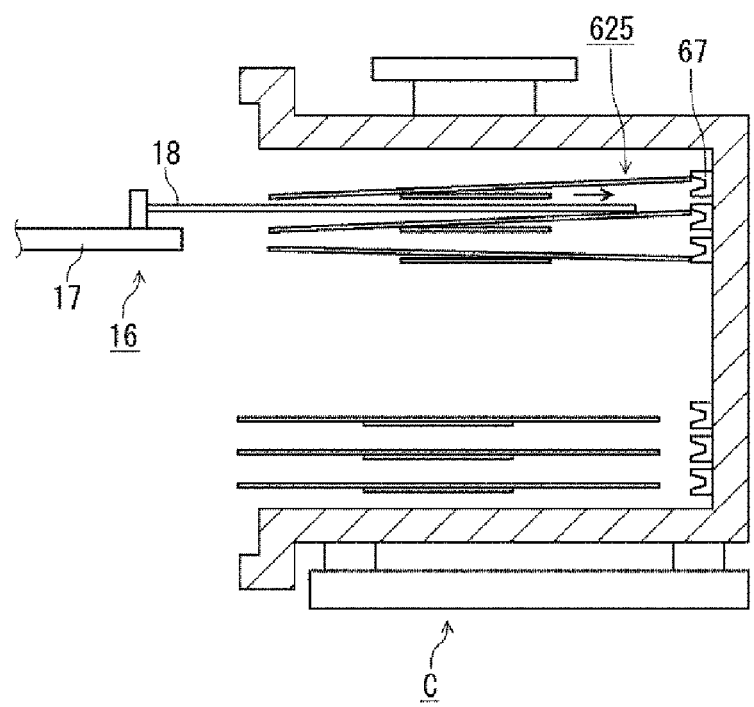
FIG. 11 is a longitudinal side view of the carrier.

Further, when each wafer W is unloaded from the container main body 6 and then is transferred to the processing block E2 as such, the fork 18 enters the container main body 6 based on the height position H1 of the wafer W acquired by, for example, the mapping process, and the fork 18 is configured not to be contacted with the wafer W at the front side of the container main body 6. To be specific, the fork 18 enters the container main body 6 at a height lower by a certain extent than the detected height of the wafer W. As depicted in FIG. 11, if the wafer W is relatively highly inclined in a forward/backward direction, a leading end of the fork 18 may be contacted with the wafer W within the container main body 6, so that the wafer W may be damaged. FIG. 11 is provided to illustrate the contact between the wafer W and the fork 18 as described above. Further, the fork 18 is allowed to first access the wafer W at the slot 625 among the slots 600 in FIG. 11. However, the wafer W at the slot 601 is actually unloaded first as described below.

Therefore, in the load port 3, before the wafer W is unloaded from the carrier C, it is possible to detect the forward protrusion of the wafer W and the inclination angle of the wafer W based on the mapping data. Then, the wafer W is adjusted to have a horizontal or substantially horizontal posture, and adjusted to have an appropriate depth position in the container main body 6. Thus, the above-described transfer error or damage to the wafer can be avoided.

Figure 12:
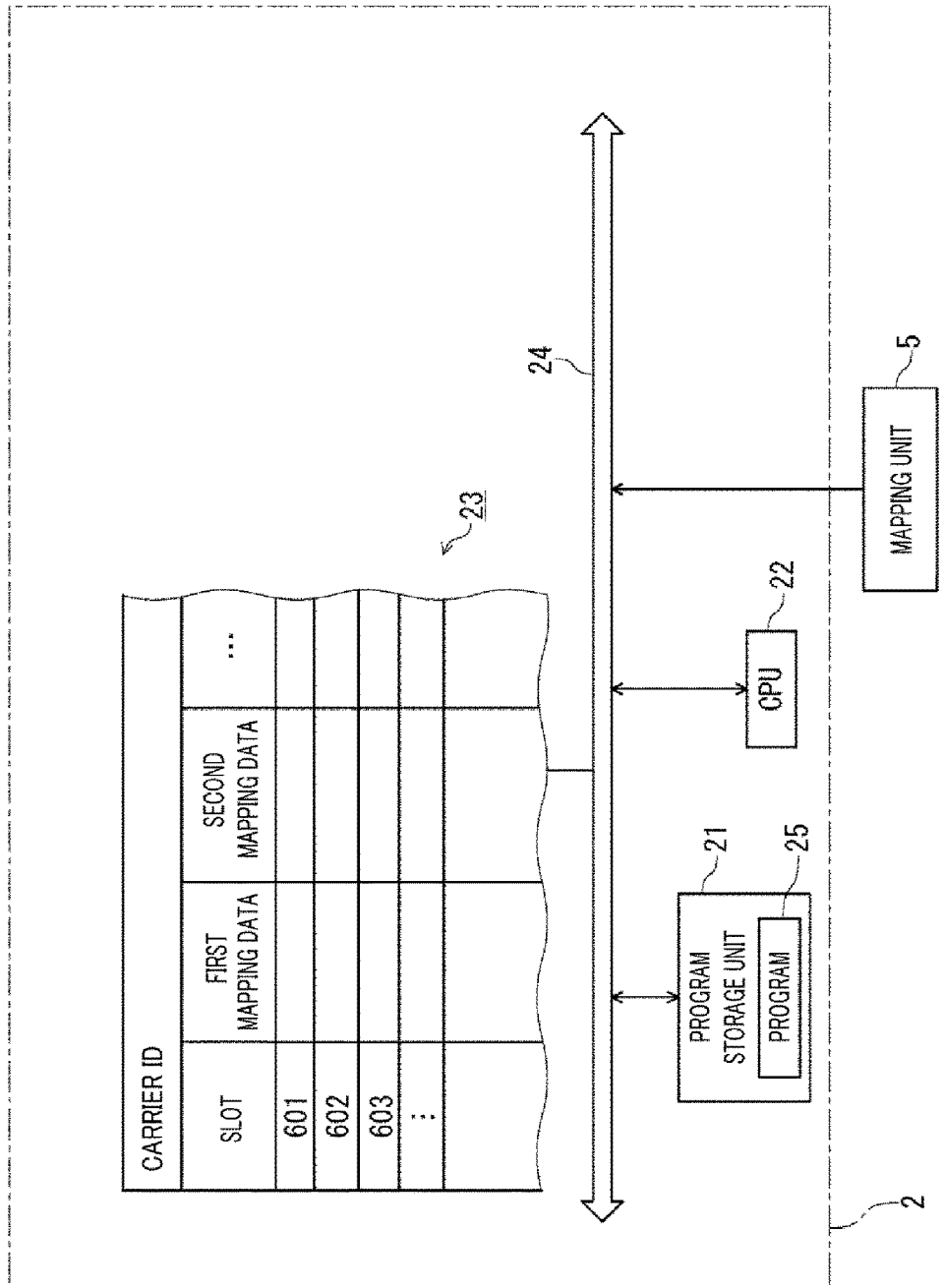
FIG. 12 is a block diagram of an apparatus controller of the coating and developing apparatus.

The apparatus controller 2 as a control unit will be explained with reference to FIG. 12. The apparatus controller 2 includes a program storage unit 21, a CPU 22, and a memory 23 which are connected to a bus 24. The mapping unit 5 is also connected to the bus 24. As described above, detection signals of the sensor pair 50 and the reflection sensor 58 are outputted to the apparatus controller 2. The program storage unit 21 is a computer-readable storage medium such as a flexible disk, a compact disk, a hard disk, a magneto-optical (MO) disk, and a memory card. A program 25 stored in the storage medium is installed in the apparatus controller 2.

The program 25 allows control signals to be transmitted to the respective components of the coating and developing apparatus 1 to control operations thereof. Further, the program 25 includes instructions (respective steps) for performing the respective operations such as transfer of the wafer W, processes of the wafer W in the respective blocks E1 to E4, unloading of the wafer W from the carrier C, and loading of the wafer W into the carrier C. The CPU 22 executes various calculations in order to output the control signals as such.

The memory 23 stores the mapping data for each carrier C. The mapping process may be carried out multiple times in a single carrier C, and the mapping data of each mapping process are stored. Although not illustrated, the memory 23 stores a tolerance range of the front/back inclination angle θ1 of the wafer W and a tolerance range of the depth position L1 of the wafer W.

Figure 13:
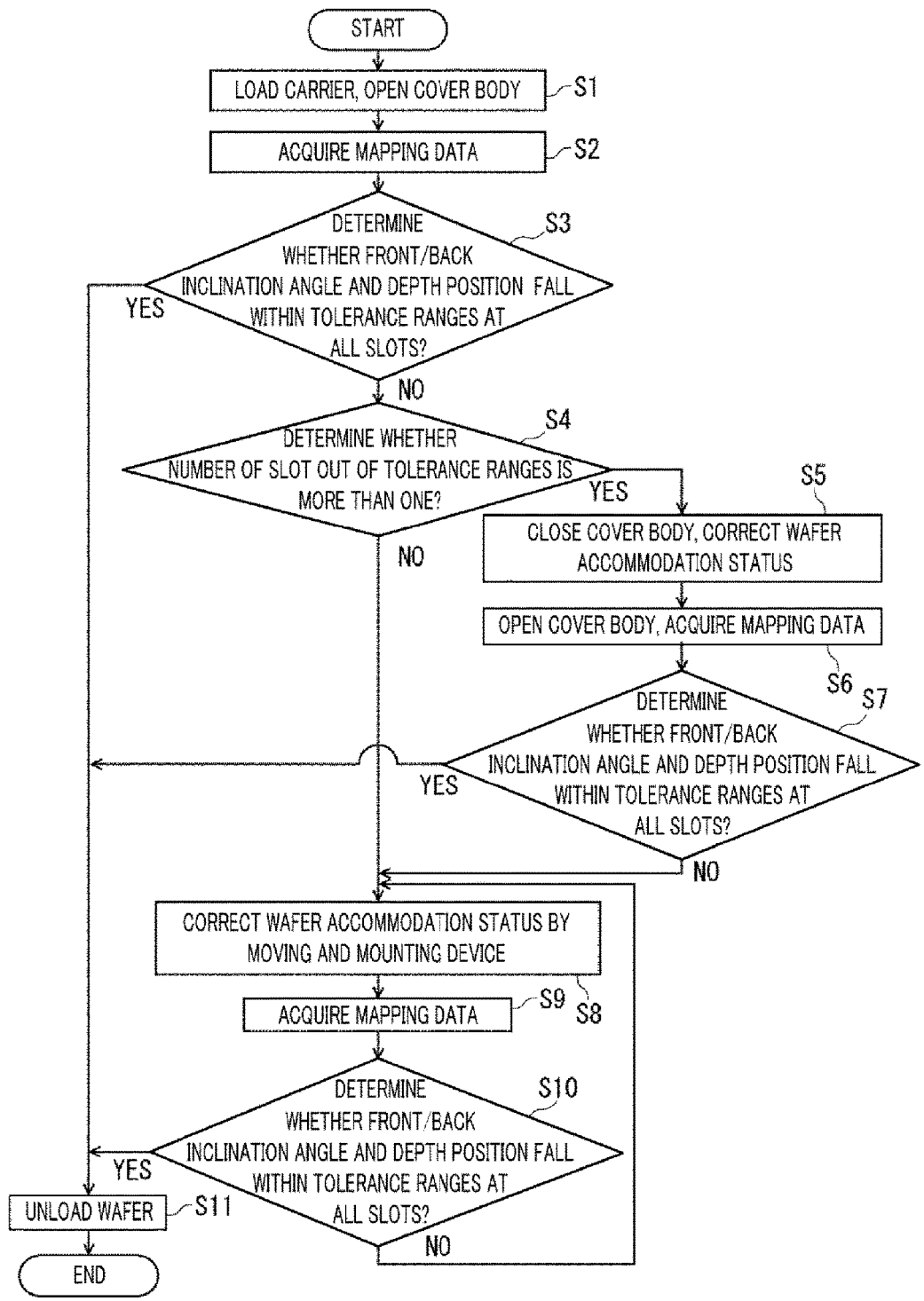
FIG. 13 is a flow chart illustrating processes for unloading the wafer from the carrier.
Figure 14:
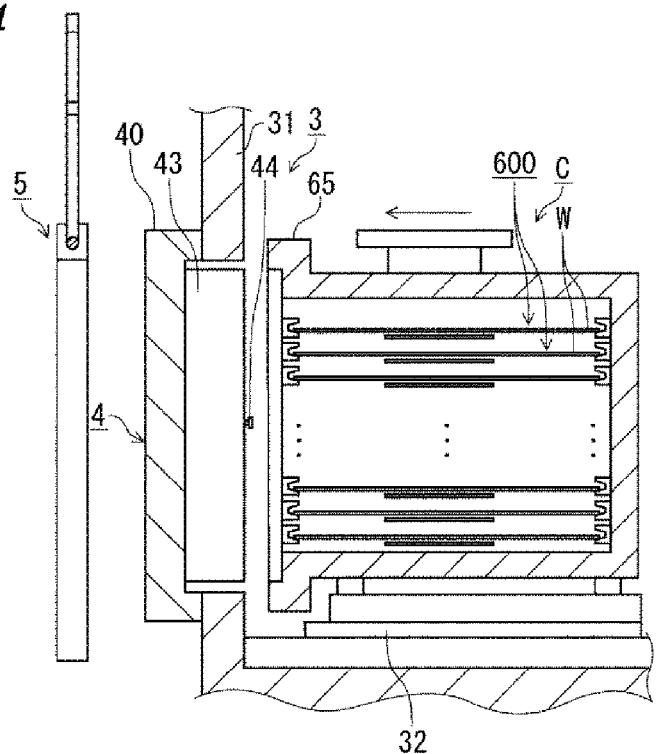
FIG. 14 is an explanatory diagram illustrating a process for correcting the accommodation status of the wafer in the carrier and a process for unloading the wafer.
Figure 15:
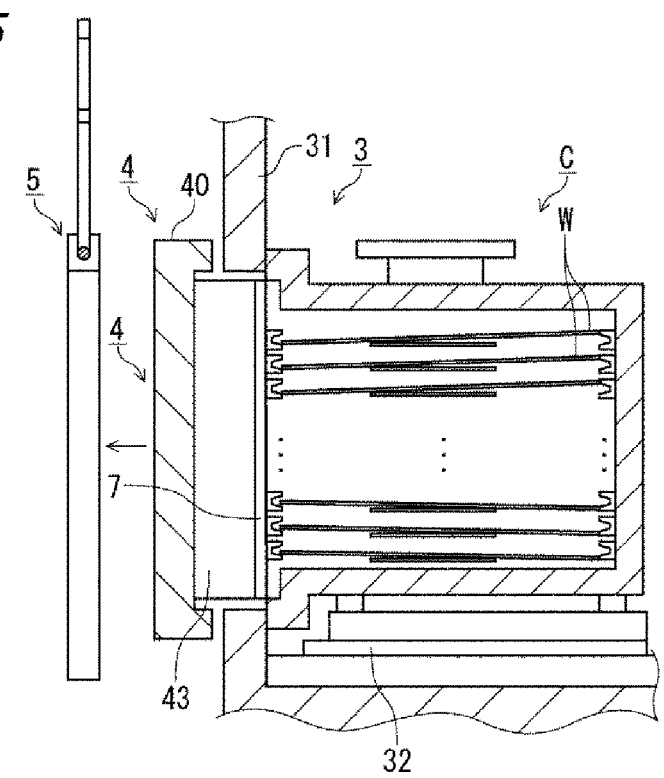
FIG. 15 is an explanatory diagram illustrating a process for correcting the accommodation status of the wafer in the carrier and a process for unloading the wafer.

A process for loading a carrier C into the coating and developing apparatus 1 and loading the wafer W in the carrier C into the apparatus will be explained with reference to the flow chart of FIG. 13, and operations of the respective components of the load port 3 will be explained with reference to FIG. 14 to FIG. 27. At block S1 (load carrier, open cover body), the carrier C is mounted on the stage 32 and positioned at the unload position by the carrier transfer device. The stage 32 is moved forward (FIG. 14), the carrier C is moved to the load position, the opening peripheral portion 65 of the carrier C is pushed by the housing 31, and the latch keys 44 are inserted into the key holes 73 of the rotating parts 71. When the latch key 44 is rotated, the cover body 7 is released from the container main body 6. When the cover body 7 is held by the cover body opening/closing device 43 of the opening/closing door 4, the door main body 40 is moved to the front side (FIG. 15) and then moved downwardly to the opening position. Then, the cover body 7 is separated from the container main body 6 and the transfer opening 33 is opened. In FIG. 15, when the cover body 7 is separated, there is the front/back inclination angle and the protrusion of the wafer W, as described above. The wafer W is inclined in the forward and backward direction since the rear portion of the wafer W is caught by the holder 67.

Figure 16:
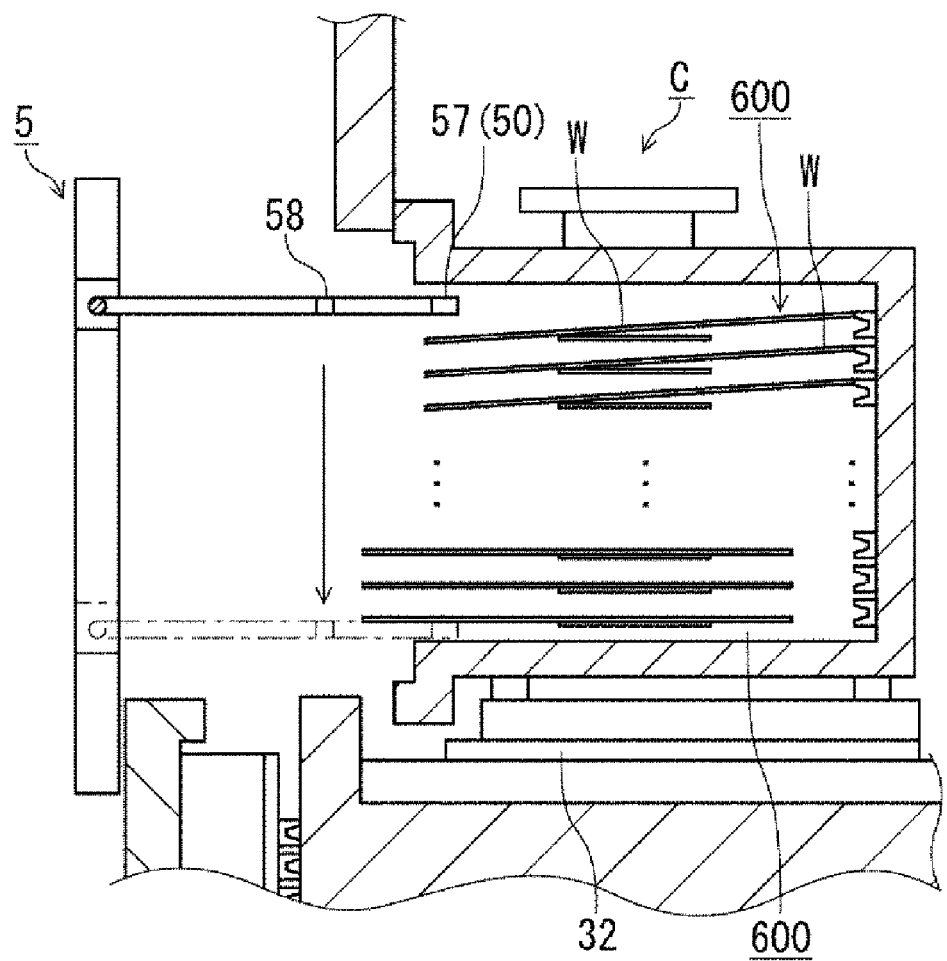
FIG. 16 is an explanatory diagram illustrating a process for correcting the accommodation status of the wafer in the carrier and a process for unloading the wafer.

Then, at block S2 (acquire mapping data), the sensor pair 50 and the reflection sensor 58 of the mapping unit 5 are moved from the sensor stand-by position to the mapping start position indicated by a solid line in FIG. 16. Further, while the light transmitting unit 56 of the sensor pair 50 and the reflection sensor 58 irradiate lights, the sensor pair 50 and the reflection sensor 58 are moved downwardly and the mapping process (first mapping process) is carried out. When the sensor pair 50 and the reflection sensor 58 are moved to the mapping finish position indicated by a dashed dotted line in FIG. 16, the light transmitting unit 56 and the reflection sensor 58 stop irradiating lights and the first mapping process is finished, and the sensor pair 50 and the reflection sensor 58 are returned to the sensor stand-by position.

At block S3 (determine whether front/back inclination angle and depth position fall within tolerance ranges at all slots), with respect to the front/back inclination angle θ1 and the depth position L1 of the wafer W among the acquired mapping data, the apparatus controller 2 determines whether or not the angle θ1 and the depth position L1 of all the wafers W fall respectively within the preset tolerance ranges. At block S4 (determine whether number of slot out of tolerance ranges is more than one), if it is determined that there is a wafer W out of the tolerance ranges, it is determined whether or not the wafer W is more than one.

Figure 17:
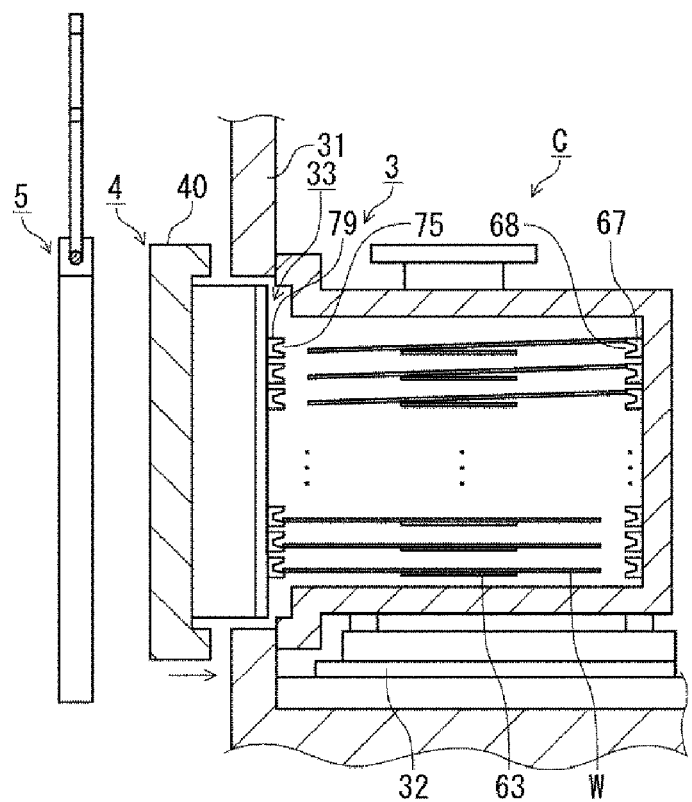
FIG. 17 is an explanatory diagram illustrating a process for correcting the accommodation status of the wafer in the carrier and a process for unloading the wafer.
Figure 18:
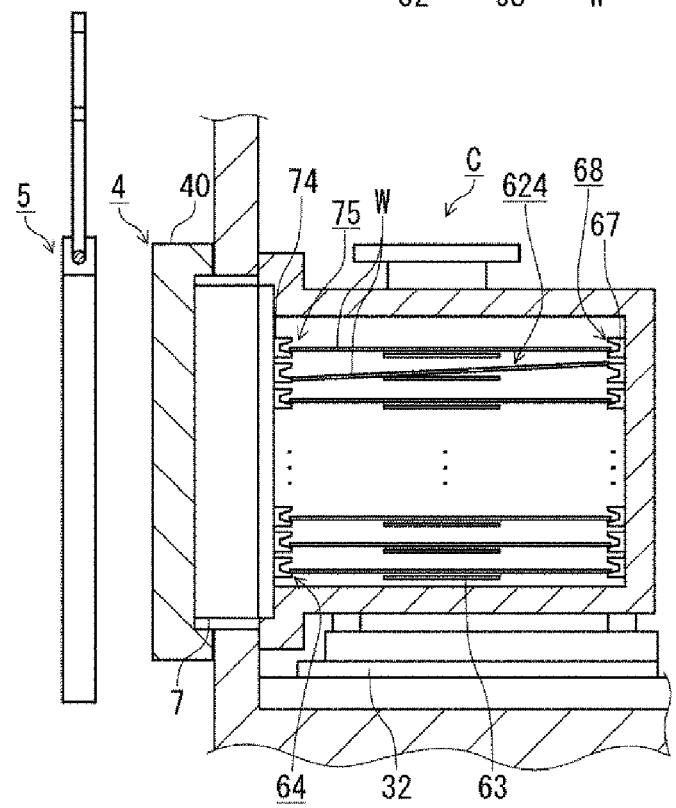
FIG. 18 is an explanatory diagram illustrating a process for correcting the accommodation status of the wafer in the carrier and a process for unloading the wafer.

If it is determined that the wafer W out of the tolerance ranges is more than one at block S4, the door main body 40 is moved upwardly and moved to the back side toward the closing position. At block S5 (close cover body, correct wafer accommodation status), a front end of the wafer W is contacted with the holder 74 of the cover body 7 held by the door main body 40, and the wafer W protruded from the unloading opening 64 is pushed into the container main body 6 by the holder 74 (FIG. 17). The door main body 40 continues to move and the wafer W inclined back and forth is pushed by the holder 74. Thus, due to the impact, the wafer W is released from the holder 67, and the wafer W can be supported on the supporting member 63 in a horizontal or substantially horizontal manner. The door main body 40 is positioned at the closing position, the unloading opening 64 of the wafer W is closed by the cover body 7, and the wafers W are held horizontally to enter the notched grooves 75 and 68 of the holders 74 and 67, respectively. In FIG. 18, it is illustrated that even with the operation of the door main body 40, while the wafer W at the slot 624 is caught by the holder 67, the front/back inclination angle of the wafer W is not corrected.

Figure 19:
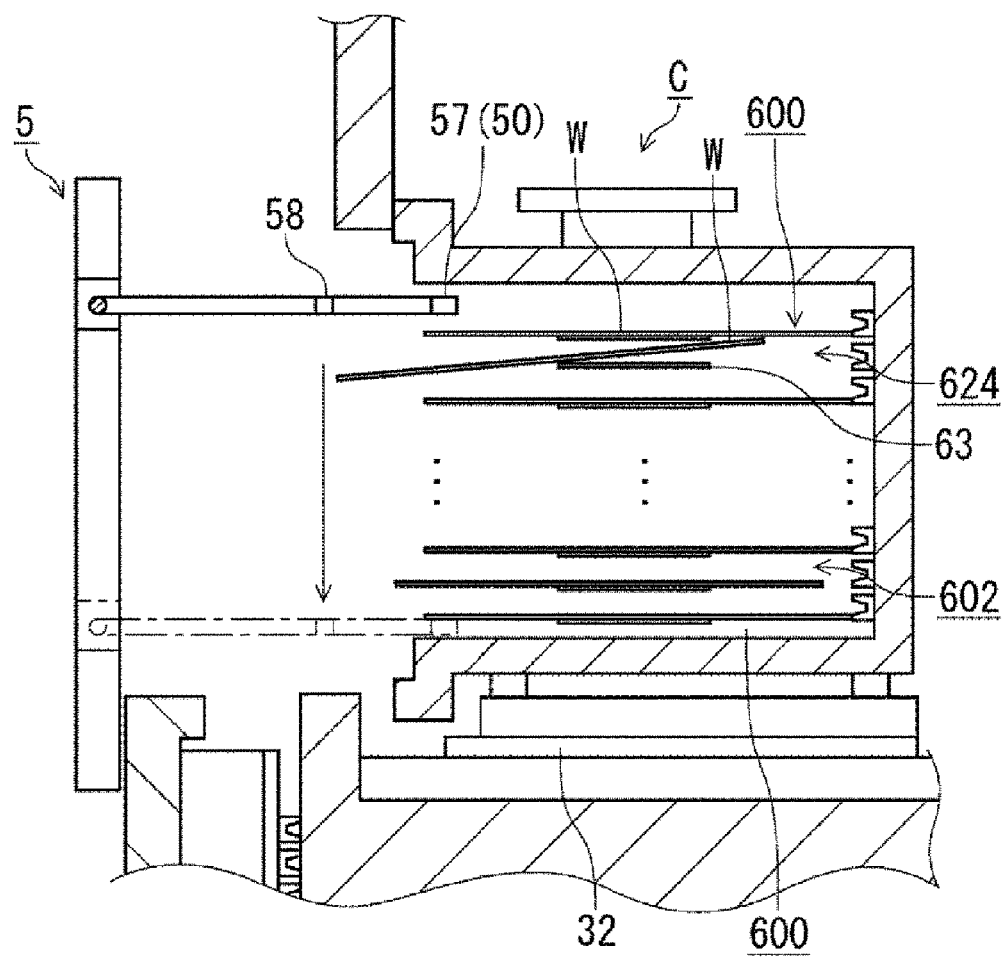
FIG. 19 is an explanatory diagram illustrating a process for correcting the accommodation status of the wafer in the carrier and a process for unloading the wafer.

Then, at block S6 (open cover body, acquire mapping data), while continuously holding the cover body 7, the door main body 40 is moved to the opening position in the same manner as shown at block S1, and the unloading opening 64 and the transfer opening 33 are opened. Thereafter, in the same manner as shown at block S2, the mapping process (second mapping process) is carried out (FIG. 19). At block S7 (determine whether front/back inclination angle and depth position fall within tolerance ranges at all slots), after the second mapping process is finished, the sensor pair 50 and the reflection sensor 58 are returned to the sensor stand-by position and the apparatus controller 2 determines whether or not the front/back inclination angle θ1 and the depth position L1 of all the wafers W among the acquired mapping data fall respectively within the tolerance ranges.

Herein, there will be explained a case where due to the impact generated when the unloading opening 64 is opened again, the wafer W at the slot 624 is inclined back and forth and protruded toward the front side, and also caught by the supporting member 63, so that the front/back inclination angle θ1 and the depth position L1 thereof are respectively out of the tolerance ranges. Further, there will be explained a case where the wafer W at the slot 602 is protruded again during the opening operation, so that the depth position L1 thereof is out of the tolerance range.

Figure 20:
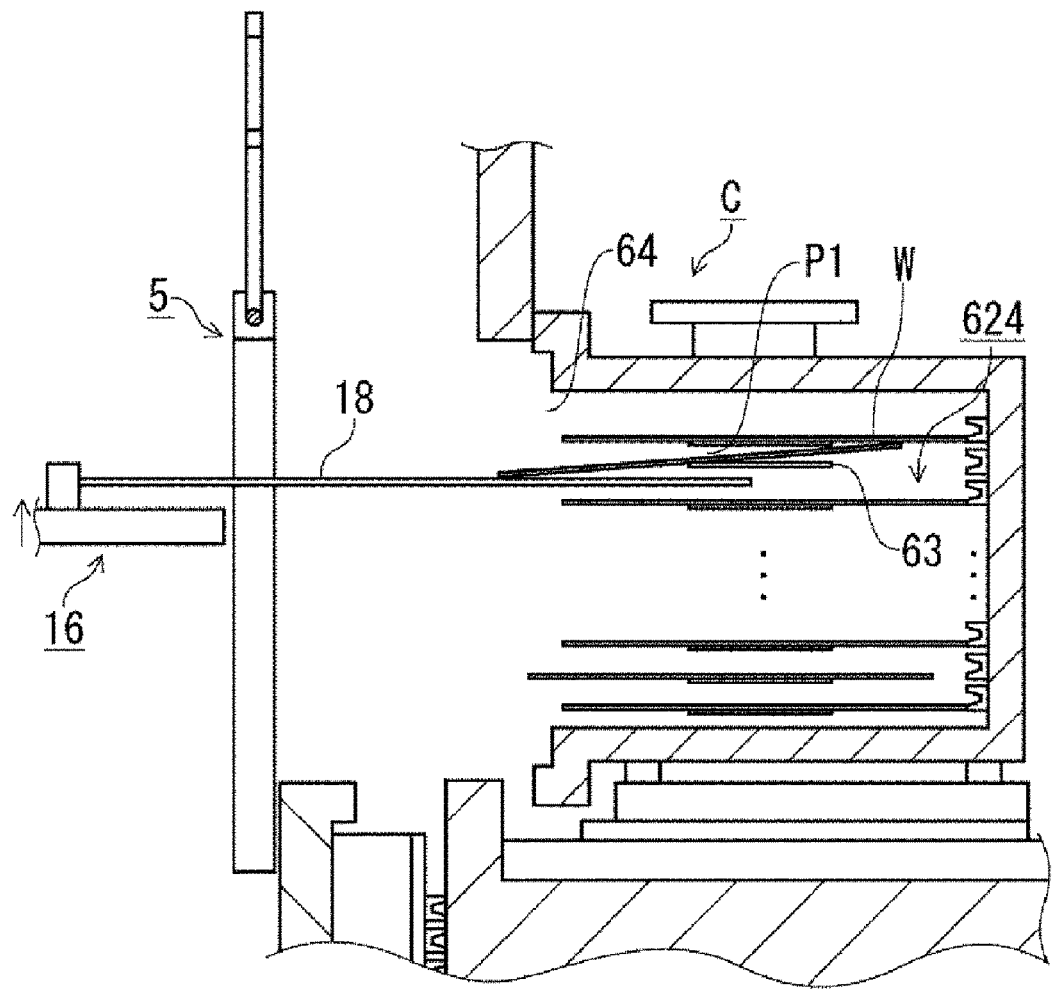
FIG. 20 is an explanatory diagram illustrating a process for correcting the accommodation status of the wafer in the carrier and a process for unloading the wafer.
Figure 21:
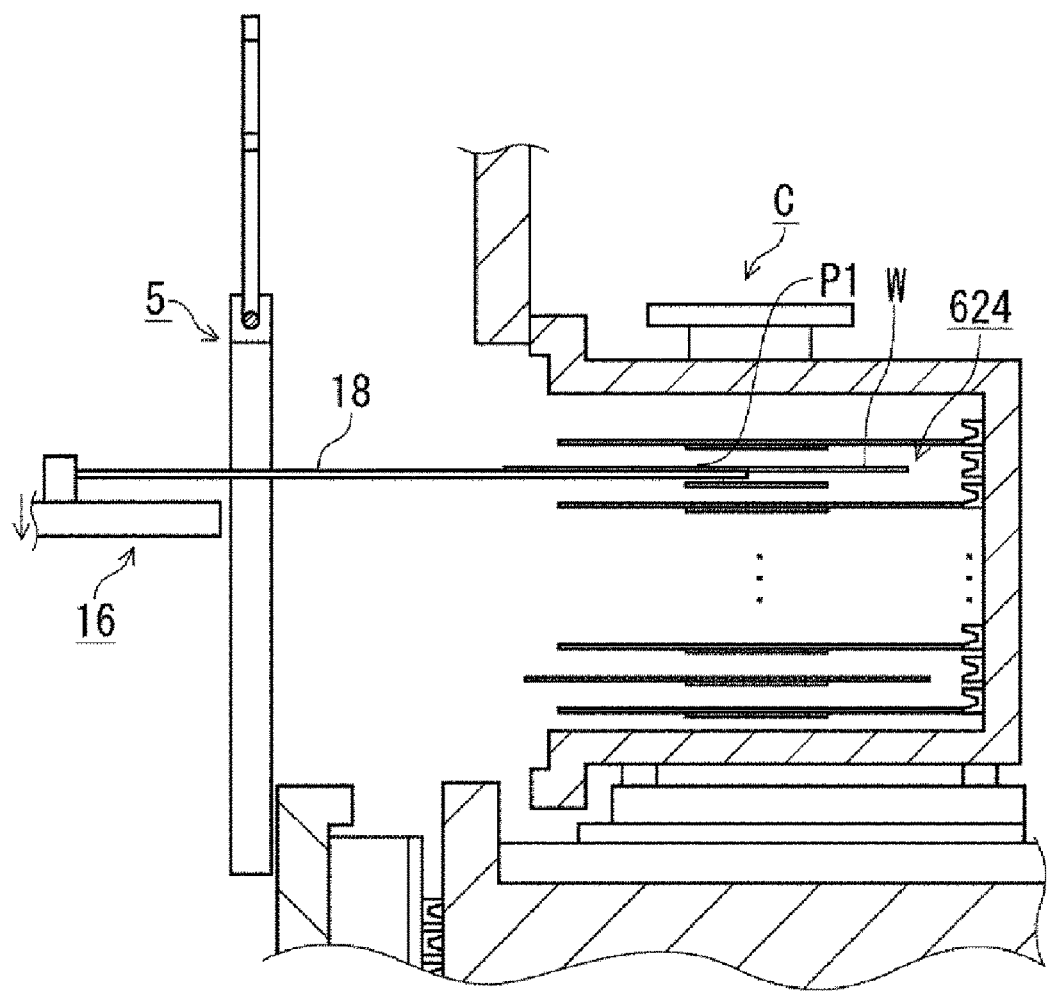
FIG. 21 is an explanatory diagram illustrating a process for correcting the accommodation status of the wafer in the carrier and a process for unloading the wafer.

At block S8 (correct wafer accommodation status by moving and mounting device), the fork 18 of the moving and mounting device 16 is moved to below the wafer W at the slot 624 based on the height position H1 of the wafer W acquired from the second mapping process. The leading end of the fork 18 is moved to an inner position than a center P1 of the wafer W acquired from the second mapping process (FIG. 20). In order to avoid damage to the wafer W, the leading end of the fork 18 is not deeper (i.e., is closer to the unloading opening 64) than a position of the leading end of the fork 18 at the time of normally entering the container main body 6 to unload the wafer W. Then, the moving and mounting device 16 is moved upwardly, and the wafer W falls from the supporting member 63 to be supported on the fork 18. Since the center P1 is in the front side more than the leading end of the fork 18, the wafer W may have a horizontal posture on the fork 18 (FIG. 21).

Figure 22:
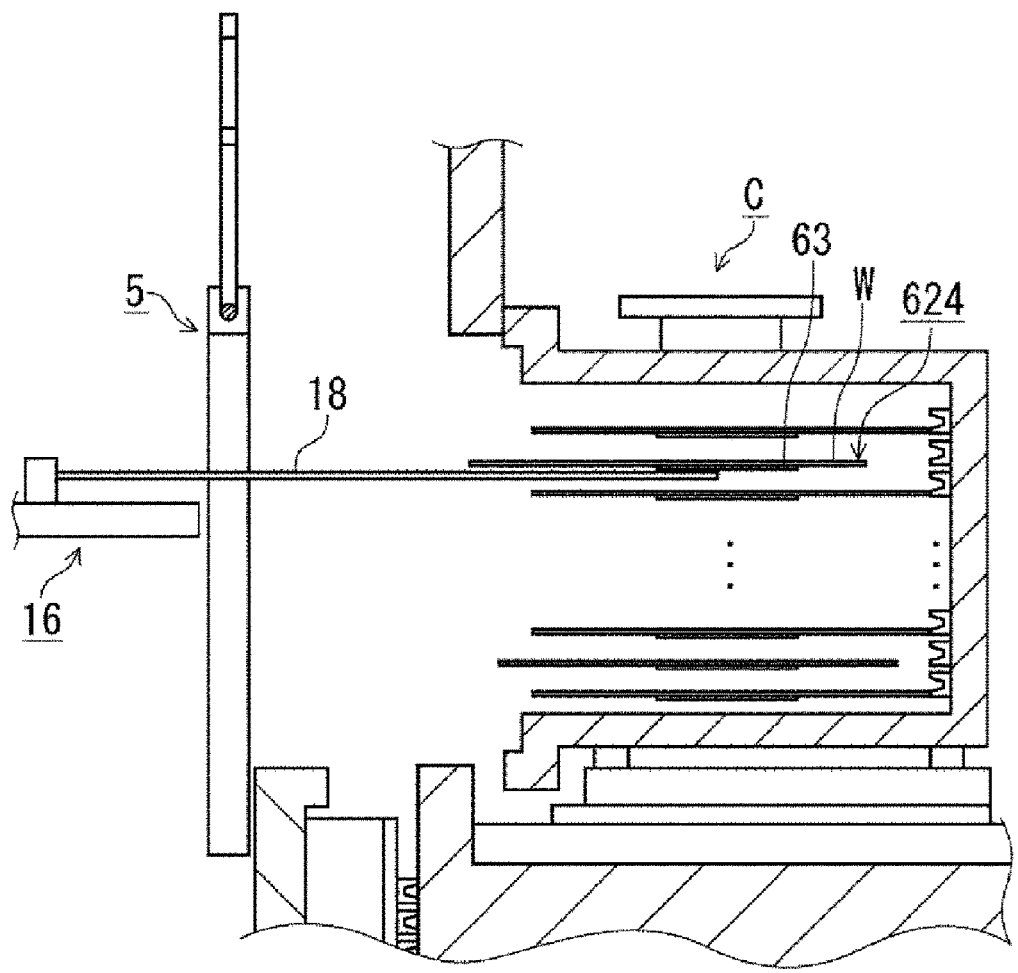
FIG. 22 is an explanatory diagram illustrating a process for correcting the accommodation status of the wafer in the carrier and a process for unloading the wafer.
Figure 23:
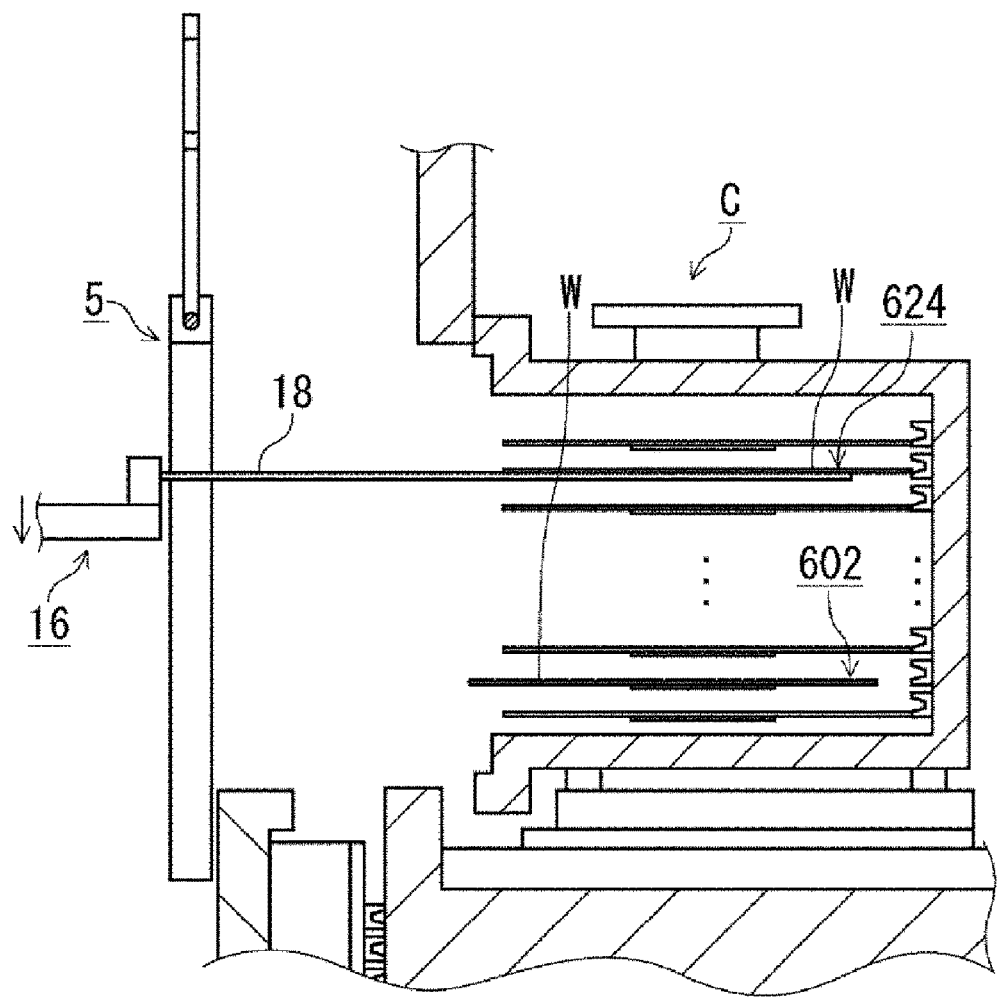
FIG. 23 is an explanatory diagram illustrating a process for correcting the accommodation status of the wafer in the carrier and a process for unloading the wafer.

Thereafter, the moving and mounting device 16 is moved downwardly and the wafer W is horizontally supported on the supporting member 63 (FIG. 22). Then, the fork 18 is further moved into the container main body 6 to stably receive the wafer W and moved to a preset position, and then, moved upwardly to receive the wafer W. After the fork 18 is moved further into the container main body 6 such that the depth position L1 can be in the tolerance range based on the depth position L1 acquired from the second mapping process, the fork 18 is moved downwardly and the wafer W is horizontally mounted on the supporting member 63 (FIG. 23).

Figure 24:
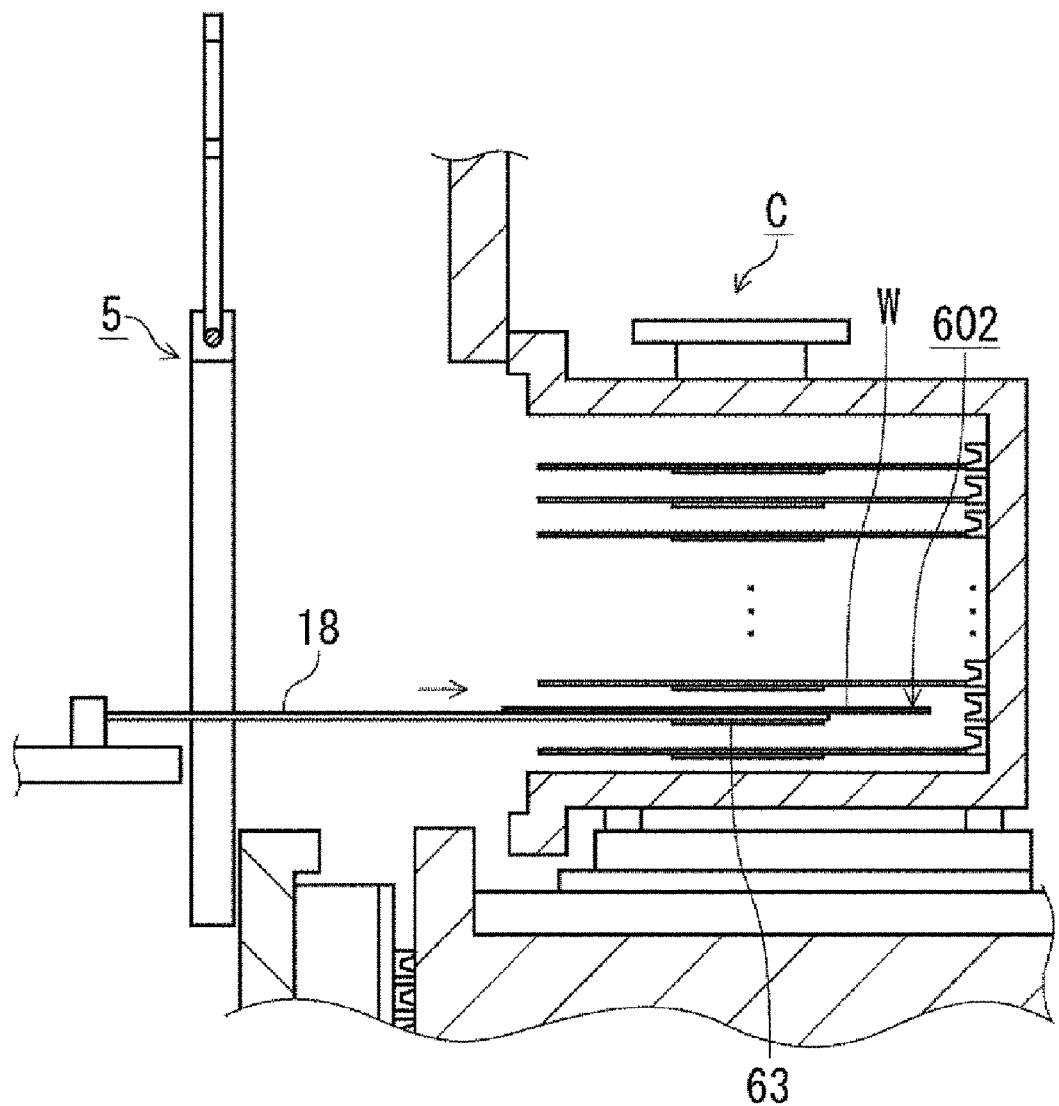
FIG. 24 is an explanatory diagram illustrating a process for correcting the accommodation status of the wafer in the carrier and a process for unloading the wafer.
Figure 25:
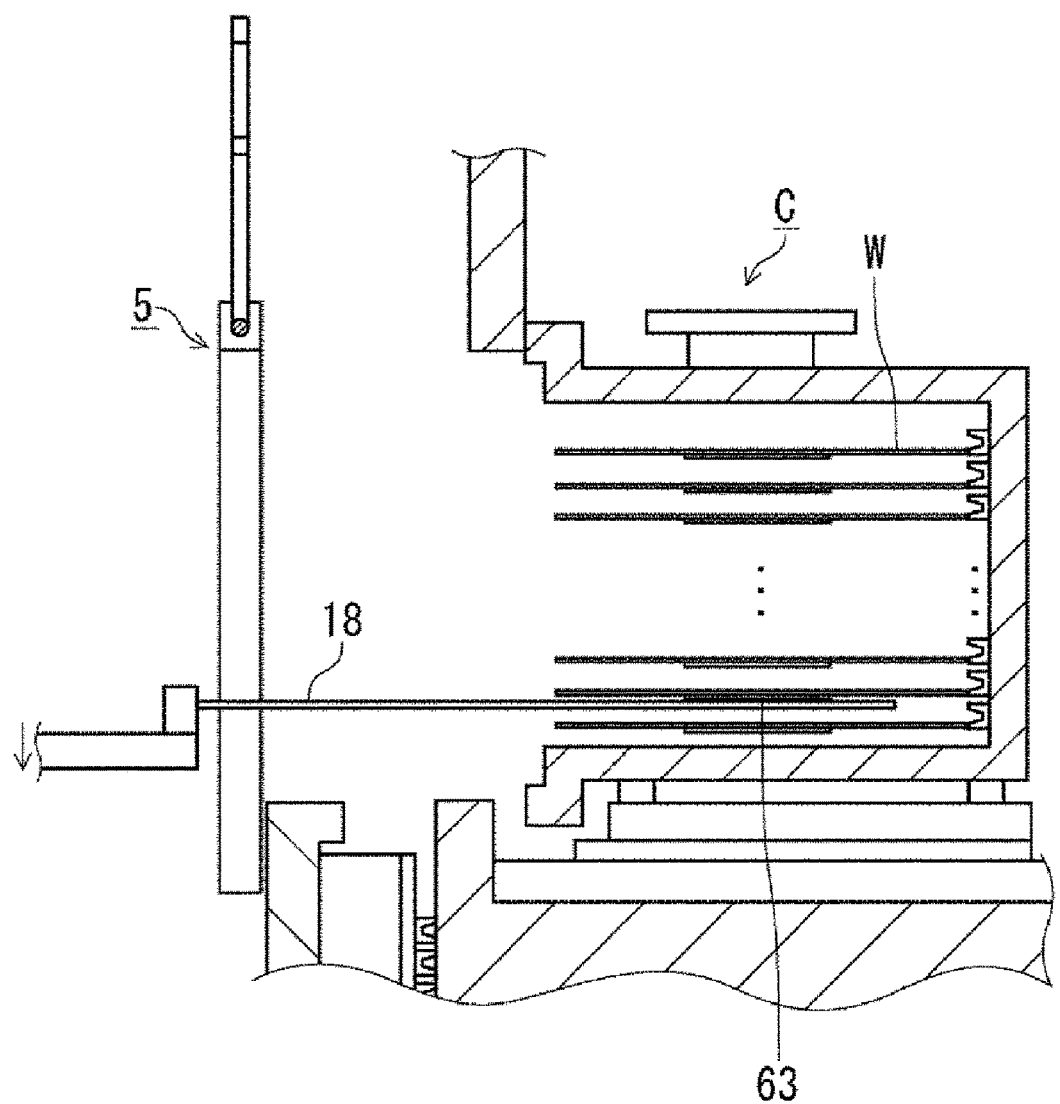
FIG. 25 is an explanatory diagram illustrating a process for correcting the accommodation status of the wafer in the carrier and a process for unloading the wafer.

Then, after the fork 18 is retreated to the outside of the container main body 6, in order to correct the depth position L1 of the wafer W at the slot 602, based on the height position H1 of the wafer W acquired from the second mapping process, the fork 18 is positioned below the wafer W at the slot 602. Further, based on the depth position L1 acquired from the second mapping process, the fork 18 is moved into the container main body 6 to a preset depth and moved upwardly to receive the wafer W (FIG. 24). Thereafter, the fork 18 is further moved such that the depth position L1 can be in the tolerance range, and then, the fork 18 is moved downwardly to mount the wafer W on the supporting member 63 (FIG. 25). Then, the fork 18 is retreated out of the container main body 6.

As described above, in order to correct the front/back inclination angle θ1 and the depth position L1 of the wafer W, the fork 18 performs an operation of entering into the container main body 6, and also an operation of further moving within the container main body 6. In this case, the entering operation and the further moving operation may be performed at a relatively low first speed in order to avoid damage to the wafer W due to a contact with the wafer W. Further, the above-described operations of the moving and mounting device 16 and the opening/closing door 4 in order to correct the front/back inclination angle θ1 and the depth position L1 of the wafer W may be described as "correcting operation for the accommodation status of the wafer W".

Figure 26:
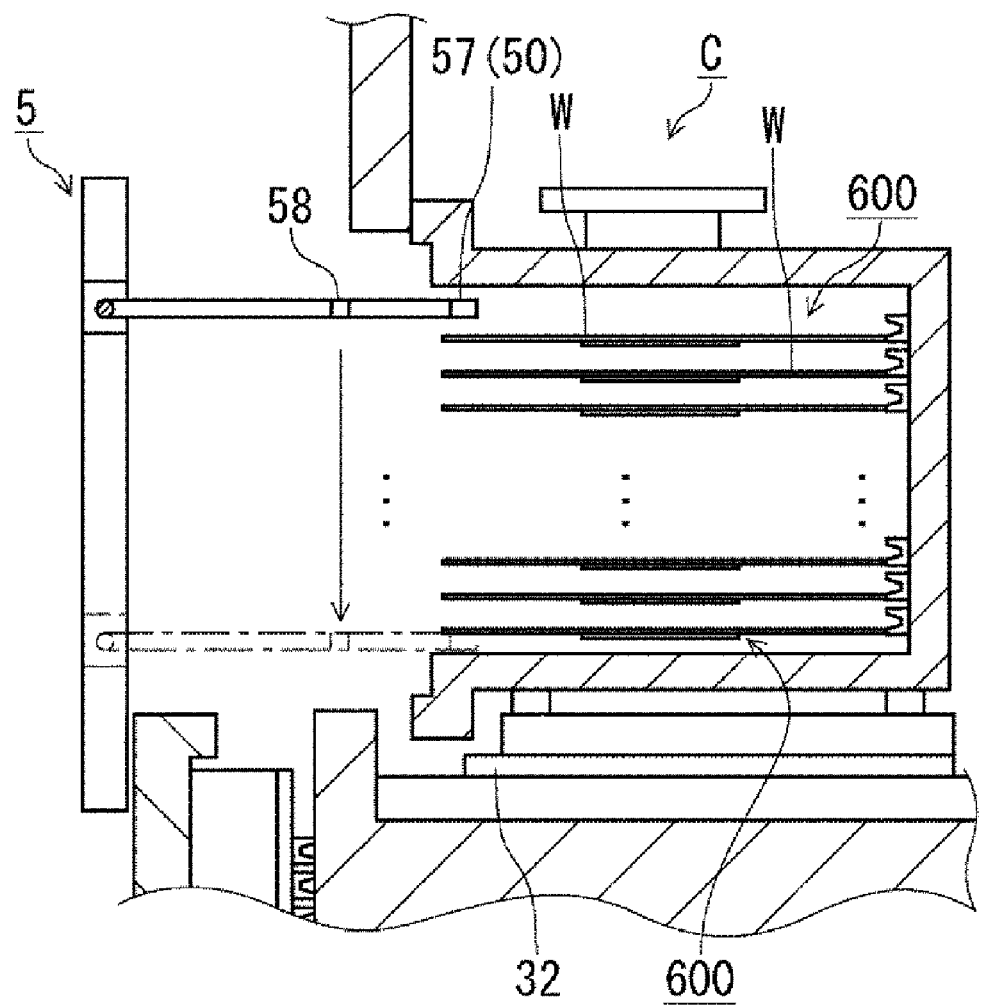
FIG. 26 is an explanatory diagram illustrating a process for correcting the accommodation status of the wafer in the carrier and a process for unloading the wafer.

Then, at block S9 (acquire mapping data), in the same manner as shown at block S2, the mapping process (third mapping process) is carried out (FIG. 26). At block S10 (determine whether front/back inclination angle and depth position fall within tolerance ranges at all slots), after the third mapping process is finished, the sensor pair 50 and the reflection sensor 58 are returned to the sensor stand-by position, and it is determined whether or not the front/back inclination angle θ1 and the depth position L1 of all the wafers W at the slots 600 fall respectively within the tolerance ranges.

Figure 27:
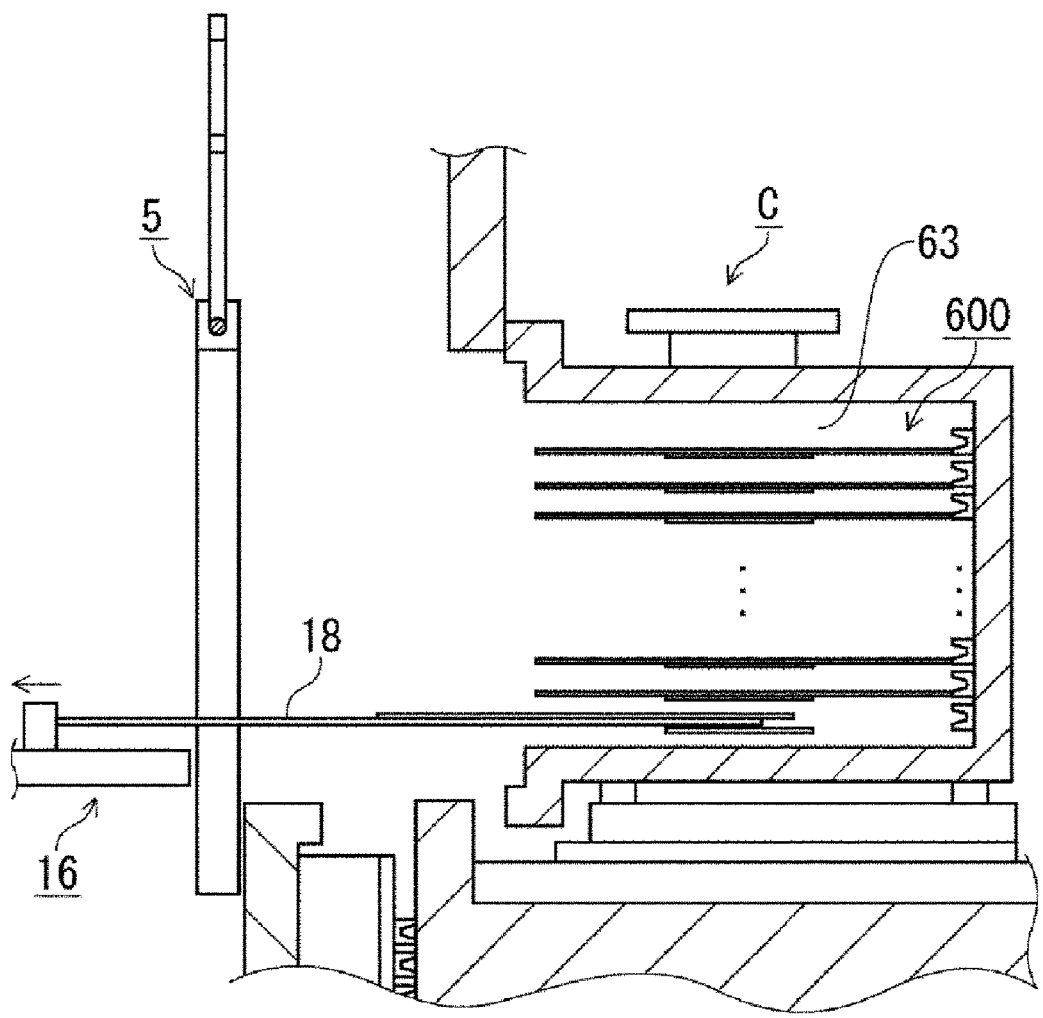
FIG. 27 is an explanatory diagram illustrating a process for correcting the accommodation status of the wafer in the carrier and a process for unloading the wafer.

At Block S11 (unload wafer), if it is determined that the front/back inclination angle θ1 and the depth position L1 fall within the tolerance ranges at block S10, the wafers W are unloaded in sequence from the lowermost slot 600 by the moving and mounting device 16 (FIG. 27). To be specific, the fork 18 enters the container main body 6 and is positioned to a rear surface of the wafer W at each slot 600 and moved upwardly to receive the wafer W, and then, the fork 18 is retreated. If a moving speed of the fork 18 when entering the container main body 6 in order to unload the wafer W from the container main body 6 is referred to as a second speed, this second speed is greater than the first speed.

If it is determined that the front/back inclination angle θ1 and the depth position L1 of all the wafers W fall respectively within the tolerance ranges at block S3, the correcting operation for the accommodation status of the wafer W is not performed, and the wafer W is unloaded as shown at block S11. Further, if it is determined that the front/back inclination angle θ1 and the depth position L1 of all the wafers W fall respectively within the tolerance ranges at block S7, the correcting operation for the accommodation status of the wafer W is not performed by the moving and mounting device 16 and the wafer W is unloaded as shown at block S11.

If it is determined that there is only one wafer W of which the front/back inclination angle θ1 and the depth position L1 are respectively out of the tolerance ranges at block S4, the correcting operation for the accommodation status of the wafer W is not performed by the opening/closing door 4 and the correcting operation for the accommodation status of the wafer W is performed only by the moving and mounting device 16 as shown at block S8. Then, blocks S8 to S11 are carried out. Further, if it is determined that there is a wafer W of which the front/back inclination angle θ1 and the depth position L1 are respectively out of the tolerance ranges at block S10, the process returns back to block S8 and the correcting operation for the accommodation status of the wafer W is performed again by the moving and mounting device 16. Then, blocks S9 and S10 are carried out again.

After the wafer W unloaded from the container main body 6 is transferred to the respective blocks E2, E3, and E4, the wafer W is returned back to the carrier block E1. Then, the wafer W is returned to the slot 600 where the wafer W is initially stored by the moving and mounting device 16. Then, closing of the transfer opening 33 by the door main body 40, attachment of the cover body 7 to the container main body 6, movement of the carrier C to the unload position, and unloading of the carrier C from the coating and developing apparatus 1 by the carrier transfer device are carried out in sequence.

In accordance with the coating and developing apparatus 1, the mapping unit 5 can detect the front/back inclination angle θ1 and the depth position L1 of the wafer W in the carrier C. Further, with respect to the wafer W of which the front/back inclination angle θ1 and the depth position L1 are respectively out of the tolerance ranges, the coating and developing apparatus 1 corrects the front/back inclination angle θ1 and the depth position L1 by using the opening/closing door 4 and the moving and mounting device 16. After the accommodation status of the wafer W is corrected as such, the wafer W in the carrier C is unloaded. Therefore, it is possible to avoid damage to the wafer W caused by the moving and mounting device 16 when the wafer W is unloaded. As a result, it is possible to suppress a decrease in production yield of a semiconductor device and also possible to improve productivity of the semiconductor device. Further, it is possible to avoid a transfer error. By way of example, the transfer error may include a case where the wafer W is not transferred to a target position of the fork 18 of the moving and mounting device 16 and the wafer W falls down from the fork 18, or a case where the wafer W is not transferred to a preset target position in the processing block E2 and a desired process is not performed on the wafer W.

Particularly, in the carrier C, a positioning deviation of the wafer W caused by the holder 74 or a catch of the wafer W caused by the holder 67 may easily occur as described above. Thus, it can be assumed that the depth position L1 and the front/back inclination angle θ1 of the wafer W are respectively out of the tolerance ranges in relatively many cases. Therefore, it is particularly effective to perform the correcting operation for the accommodation status of the wafer W by the opening/closing door 4 and the moving and mounting device 16 as described above. Further, in order to perform the correction operation, it is not necessary to transfer the carrier C to another apparatus by a moving and mounting member and perform the correcting operation in the another apparatus and it is not necessary for a user of the coating and developing apparatus 1 to correct the accommodation status by himself or herself. For this reason, it is also possible to improve productivity of a semiconductor device. Further, the coating and developing apparatus 1 is advantageous in that it is not necessary to install the moving and mounting member.

If there are two or more wafers W of which the front/back inclination angle θ1 and the depth position L1 acquired from the first mapping process are abnormal, the correcting operation for the accommodation status of the wafers W is performed by the opening/closing door 4 at the same time. If there is only one abnormal wafer W, the correcting operation for the accommodation status of the wafers W is performed only by the moving and mounting device 16, and the correcting operation for the accommodation status by the opening/closing door 4 may be omitted. Therefore, it is possible to avoid an increase in time required for correcting the accommodation status of the wafer W. As a result, it is possible to avoid a decrease in throughput. Further, whether the correcting operation of the moving and mounting device 16 is performed or the correcting operation of the opening/closing door 4 is performed depends on the number of the wafers W, and the number of the wafers W is not limited to this example. By way of example, even if there are three abnormal wafers W, the correcting operation of the opening/closing door 4 may not be performed but the correcting operation of the moving and mounting device 16 may be performed.

The center of the wafer W is calculated to correct the front/back inclination angle θ1 of the wafer W by the moving and mounting device 16. However, without calculating the center of the wafer W, a preset entrance distance of the fork 18 into the container main body 6 when the correcting operation is performed is previously determined, and then, the fork 18 may enter the container main body 6 to the preset entrance distance. In order to avoid damage to the wafer W as described above, the preset entrance distance is smaller than an entrance distance of the fork 18 into the container main body 6 when the wafer W is normally unloaded.

The mapping unit 5 is not limited to the above-described configuration example as long as it can calculate the height position, the depth position L1 and the front/back inclination angle θ1 of each wafer W. By way of example, instead of the light receiving unit 57 and the light transmitting unit 56, another reflection sensor, which is the same as the reflection sensor 58, may be provided, and the above-described respective parameters may be acquired from each reflection sensor. Further, the correcting operations for the accommodation status of the wafer W are not limited to be performed according to the above-described flow. By way of example, after the correcting operation of the opening/closing door 4 is performed first, if there is a wafer W of which depth position L1 and the front/back inclination angle θ1 are respectively out of the tolerance ranges, the correcting operation of the opening/closing door 4 may be performed repeatedly.

The transfer container to be transferred to the coating and developing apparatus 1 is not limited to the carrier C. By way of example, a carrier D illustrated at an upper portion of FIG. 28 may be transferred to the coating and developing apparatus 1. Unlike the carrier C, the carrier D does not include the holders 67 and 74. Thus, when the cover body 7 is engaged with the container main body 6, the wafer W is horizontally supported on the supporting member 63. Further, since the wafer W is not supported on the holder 74 in the carrier D, the wafer W does not move toward the front side when the cover body 7 is separated.

Figure 29:
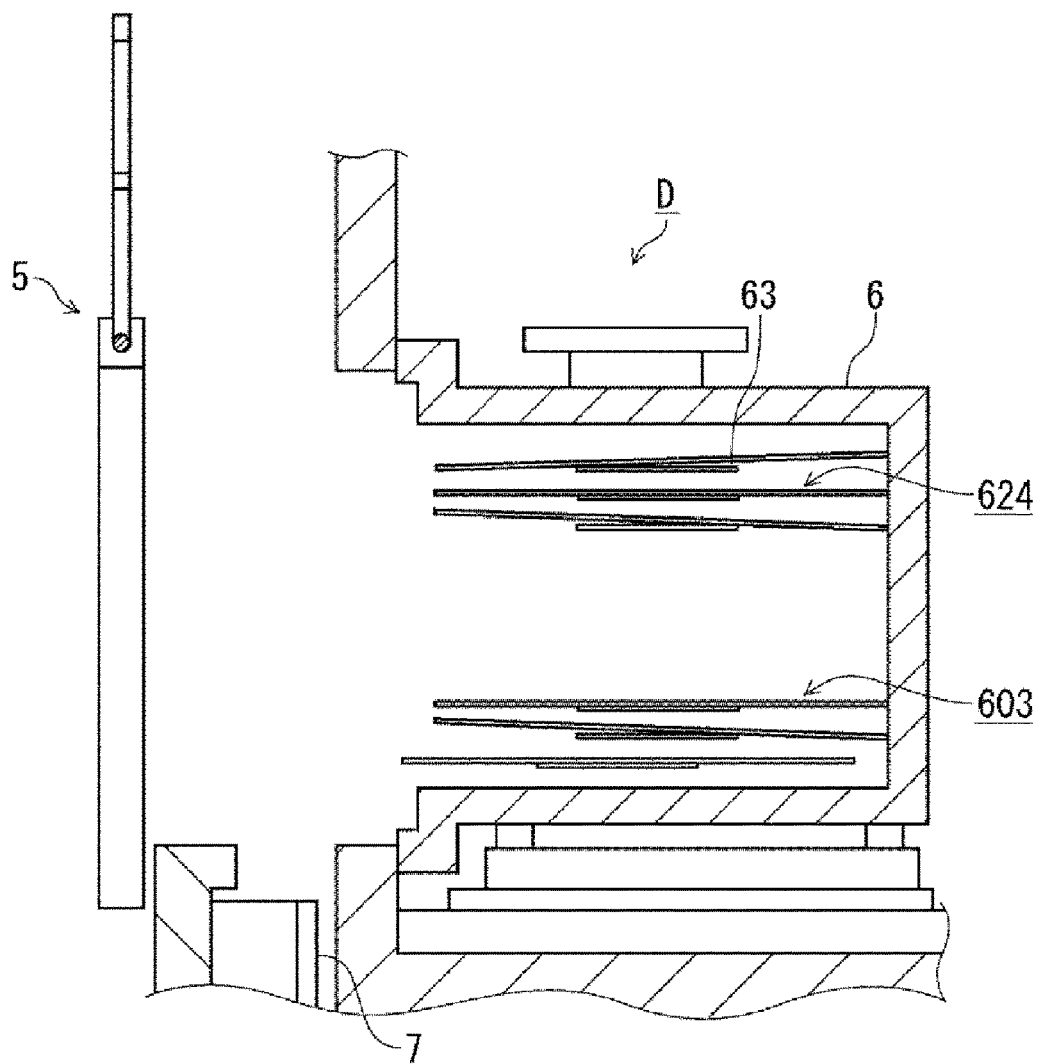
FIG. 29 is an explanatory diagram illustrating an accommodation status of a wafer in the another carrier.

In the carrier D, for example, when the cover body 7 is separated from the container main body 6, a film on a surface of the wafer W may be attached to the cover body 7 and the cover body 7 and the wafer W may be moved together, so that the wafer W may be protruded from the unloading opening 64 of the container main body 6. Further, due to the impact generated when the cover body 7 is separated from the container main body 6, the wafer W may be inclined back and forth to be supported on the supporting member 63 and an inner wall of the container main body 6. FIG. 29 illustrates an example of an accommodation status of the wafer W in the carrier D in which the protrusion or inclination of the wafer occurs. Herein, the wafers W at the slots 603 and 624 are appropriately positioned in the tolerance ranges of the depth position L1 and the front/back inclination angle θ1.

Figure 28:
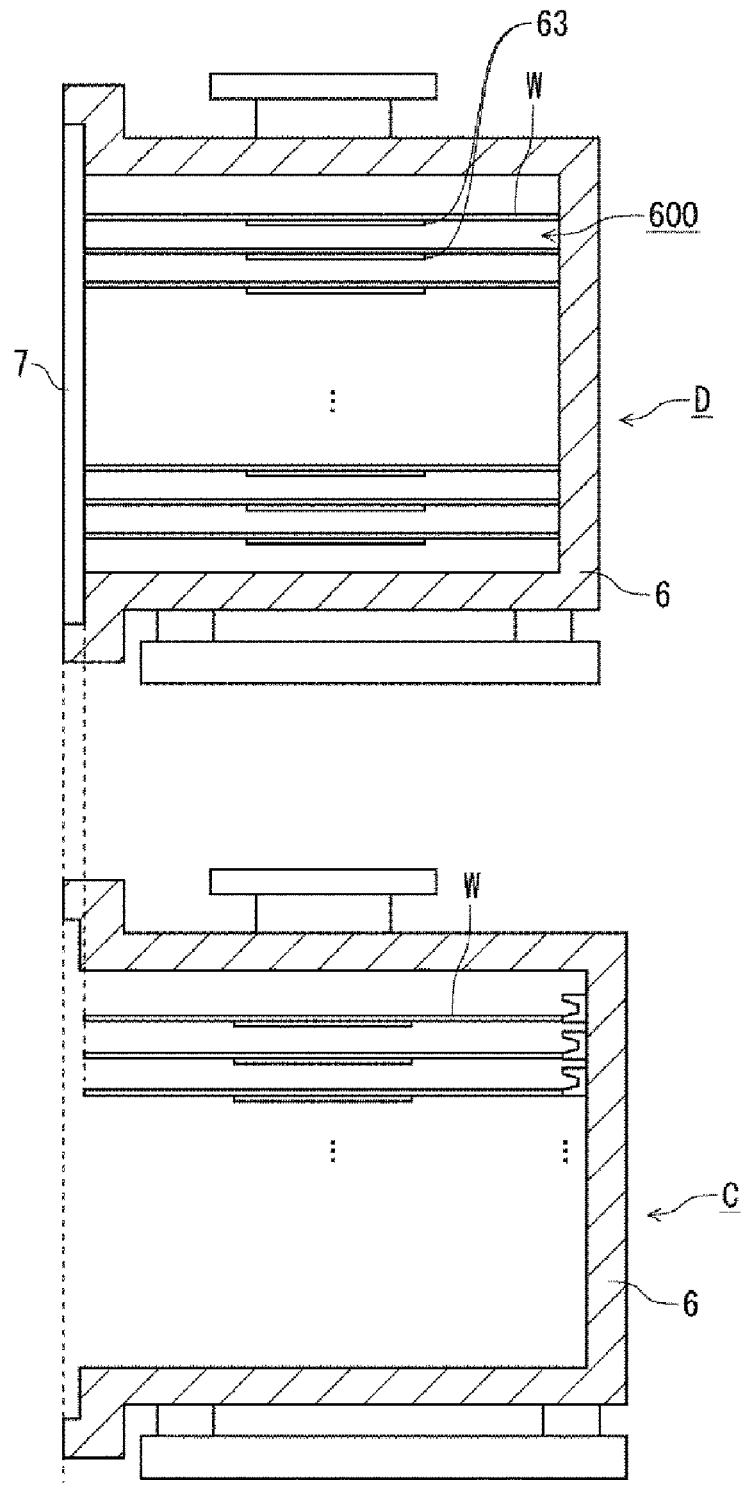
FIG. 28 is a longitudinal side view of the carrier and another carrier.

At a lower portion of FIG. 28, the container main body 6 of the carrier C separated from the cover body 7 is illustrated. Further, the wafer W in the container main body 6 illustrated in the drawing is placed at an appropriate position in the tolerance ranges of the depth position L1 and the front/back inclination angle θ1. The wafer W in the carrier D illustrated at the upper portion of FIG. 28 is also placed at an appropriate position. As depicted in FIG. 28, as viewed from the leading ends of the container main bodies 6 of the carriers C and D, the appropriate positions the wafers W in the carriers C and D are identical or substantially identical with each other. Therefore, when the correcting operation for the accommodation status is performed by the opening/closing door 4 in the carrier D, the wafer W can be moved to the appropriate position and the fork 18 can receive the wafer W accordingly. That is, the accommodation status of the wafer W can also be corrected in the carrier D according to the above-described flow applied to the carrier C.

Figure 30:
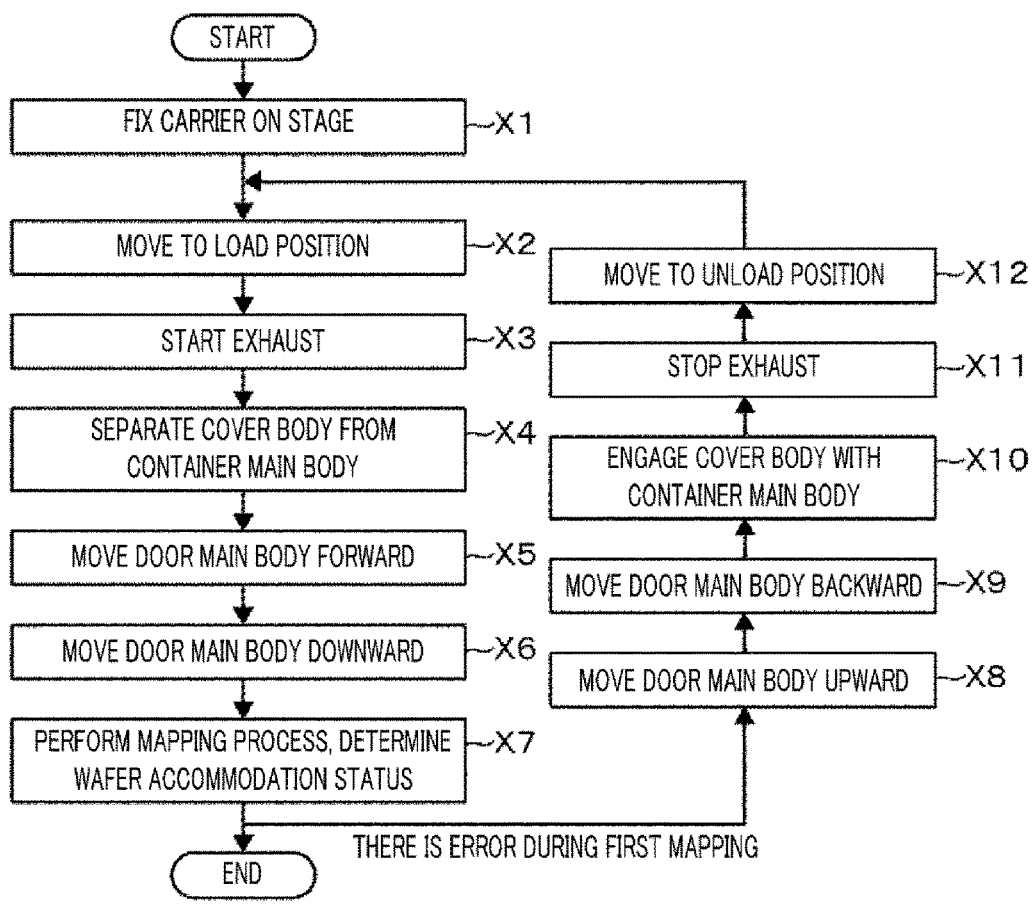
FIG. 30 is a flow chart illustrating an operation at the load port.

There will be explained another operation example of the load port 3 carried out to correct the accommodation status of the wafer W in the carrier C. FIG. 30 is a flow chart illustrating this operation example. Referring to this flow chart, differences from the operation example illustrated in FIG. 13 will be explained. Above all, at block X1 (fix carrier on stage), the carrier C transferred to the carrier block E1 by the non-illustrated carrier transfer device is mounted on the stage 32 and positioned at the unload position. The carrier C is fixed on the stage 32 by a non-illustrated clamp device provided at the stage 32. At block X2 (move to load position), the stage 32 is moved forward and the latch key 44 enters the key hole 73 of the cover body 7 in the carrier C, so that the carrier C is positioned at the load position. At block X3 (start exhaust), the inside of the transfer opening 33 within the housing 31 of the load port 3 is exhausted via a non-illustrated exhaust opening.

At block X4 (separate cover body from container main body), when the latch key 44 is rotated, the cover body 7 and the container main body 6 are separated from each other. At block X5 (move door main body forward), the door main body 40 holding the cover body 7 is moved forward. Then, at block X6 (move door main body downward), the door main body 40 is moved downwardly, so that the transfer opening 33 is opened. The fixing of the carrier C as shown at block X1 and the exhaust as shown at block X3 are carried out in the same manner in the above-described present example embodiment. That is, blocks X1 to X6 correspond to block S1 of the above-described flow as shown in FIG. 13. After the transfer opening 33 is opened, at block X7 (perform mapping process, determine wafer accommodation status), the first mapping process is carried out, and the apparatus controller 2 determines whether or not the front/back inclination angle θ1 and the depth position L1 of all the wafers W fall respectively within the tolerance ranges. Block X7 corresponds to blocks S2 and S3 of the above-described flow.

If it is determined that there is a wafer W of which the front/back inclination angle θ1 and the depth position L1 are respectively out of the tolerance ranges at block X7, the door main body 40 is moved upwardly at block X8 (move door main body upward). Then, at block X9 (move door main body backward), the door main body 40 is moved to the back side. Blocks X8 and X9 correspond to block S5 of the above-described flow, and when blocks X8 and X9 are carried out, as illustrated in FIG. 17 and FIG. 18, the transfer opening 33 is closed, the unloading opening 64 of the wafer W of the container main body 6 is closed by the cover body 7, so that the accommodation status of the wafer W is corrected. Then, at block X10 (engage cover body with container main body), the latch key 44 is rotated, so that the cover body 7 and the container main body 6 are engaged with each other. Then, at block X11 (stop exhaust), the exhaust in the inside of the transfer opening 33 is stopped. Then, at block X12 (move to unload position), the stage 32 is retreated and the carrier C is moved to the unload position. After the carrier C is moved to the unload position, blocks X2 to X7 are carried out again.

If the operation of the load port 3 is controlled according to blocks X1 to X12, depending on a determination result of block X7 performed in the second time, it is determined whether or not an alarm indicating an error detection during the mapping process is outputted. Referring to the flow chart of FIG. 31 that illustrates a flow of the operation until the alarm is outputted, the operation of the load port 3 will be further explained. Some of blocks X illustrated in FIG. 30 are described as blocks Y in FIG. 31. Correspondence between blocks X and Y will be explained appropriately. First, at block Y1 (perform first mapping process), the first mapping process is carried out. Then, at block Y2 (there is error), it is determined whether or not the front/back inclination angle θ1 and the depth position L1 of all the wafers W fall respectively within the tolerance ranges). Blocks Y1 and Y2 correspond to block X7 in the first time of the flow as depicted in FIG. 30. Before block Y1 is carried out, blocks X1 to X6 are carried out.

If it is determined that there is a wafer W out of the tolerance ranges at block Y2, block Y3 (close transfer opening of wafer, engage cover body with container main body, move carrier to unload position, move carrier again to load position, separate engagement, open transfer opening, perform second mapping process) is carried out, and then, block Y4 (there is error during second mapping process) is carried out. At block Y3, the transfer opening 33 is opened, the cover body 7 and the container main body 6 are engaged with each other, the carrier C is moved to the unload position, the carrier C is moved to the load position again, the cover body 7 is separated from the container main body 6, the transfer opening 33 is opened, and the second mapping process is performed. At block Y4, it is determined whether or not the front/back inclination angle θ1 and the depth position L1 of all the wafers W fall respectively within the tolerance ranges based on data acquired from the second mapping process. That is, blocks Y3 and Y4 correspond to blocks X2 to X7 carried out again after blocks X8 to X12.

If it is determined that there is a wafer W out of the tolerance ranges at block Y4, at block Y5 (output alarm), the alarm is outputted and the error detection during mapping is informed to the user of the coating and developing apparatus 1. By way of example, the alarm is outputted by outputting a preset voice or outputting a preset display on a screen of a computer. At block Y5, in the container main body 6 in which the error is detected, all the wafers W may not be unloaded, or only the wafer W determined as being out of the tolerance ranges may not be unloaded and the other wafers W may be unloaded. Further, in the same manner as shown at block S8 of the above-described example embodiment, after correcting the accommodation status of the wafer W determined as being out of the tolerance ranges by the fork 18, all the wafers W in the container main body 6 may be unloaded. If it is determined that the front/back inclination angle θ1 and the depth position L1 of all the wafers W fall respectively within the tolerance ranges at blocks Y2 and Y4, the alarm is not outputted. Then, at block Y6 (unload wafer from carrier), the wafers W are unloaded from the container main body 6, in the same manner as shown at block S11 of the above-described flow with reference to FIG. 13.

Figure 31:
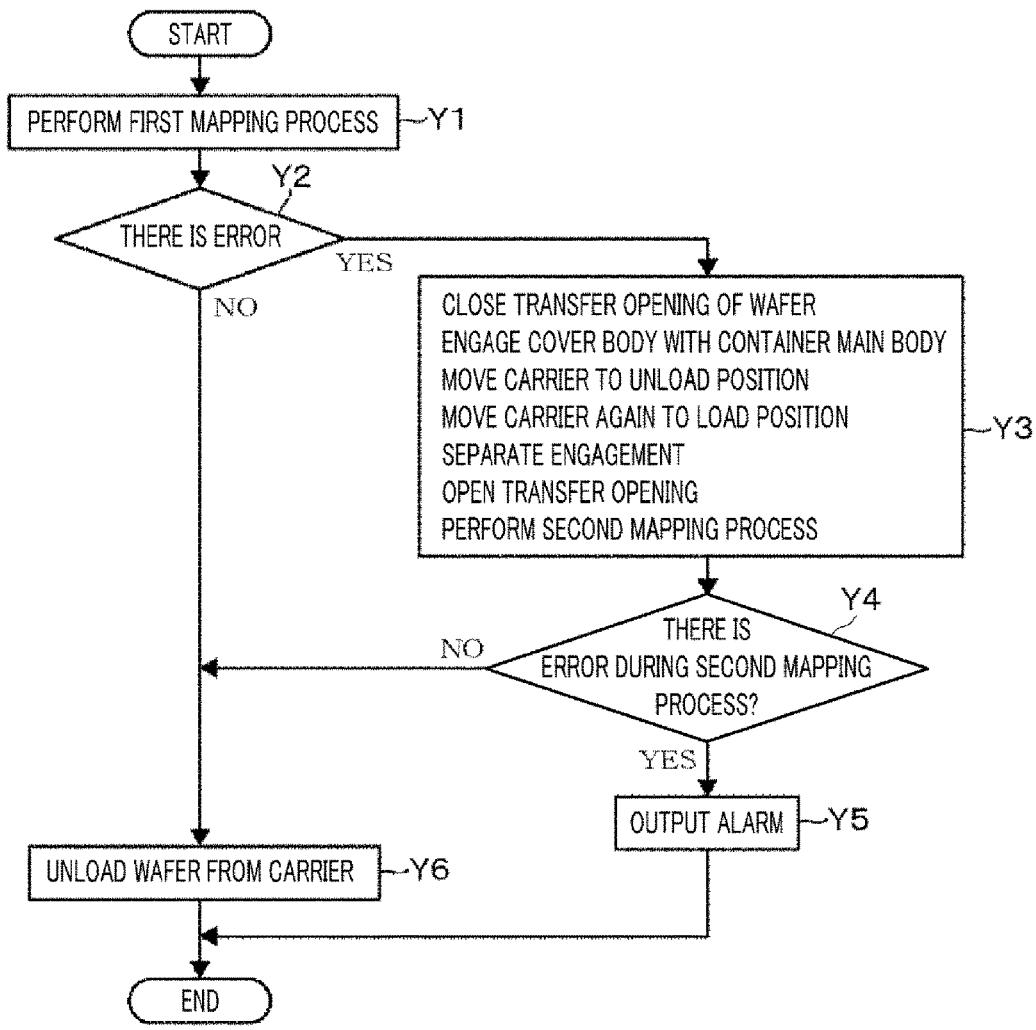
FIG. 31 is a flow chart illustrating an operation at the load port.

Even when the operation of the load port 3 is controlled as such, if an error in the accommodation status of the wafer W is detected by the mapping process, the accommodation status of the wafer may be corrected by closing the unloading opening 64 of the container main body 6 with the cover body 7 of the carrier C. Further, in the present example embodiment, after the unloading opening 64 is closed, the carrier C is moved to the unload position and then returned to the load position. By moving the carrier C between the load position and the unload position, even if the wafer W is held by the holders 67 and 74 at an abnormal angle in the carrier C, vibration may be applied to the carrier C by such a movement of the carrier C and a position of the wafer W may be changed on the holders 67 and 74 in the carrier C, so that the abnormal inclination of the wafer W can be corrected and the wafer W can be normally held by the holders 67 and 74. If the abnormal inclination of the wafer W is corrected during the movement as such, a probability of abnormality in the depth position L1 and the front/back inclination angle θ1 when the cover body 7 is opened can be suppressed to be low. Even if the flows shown in FIG. 30 and FIG. 31 are performed by using the carrier D instead of the carrier C, abnormal inclination of the wafer W at the supporting member 63 can be corrected. From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A substrate transfer method of unloading a substrate from a transfer container in which a cover body airtightly closes a substrate unloading opening formed at a front surface of a container main body and multiple substrates are accommodated in the form of shelves, the substrate transfer method comprising:
   loading the transfer container to a load port, and separating the cover body from the container main body;
   detecting an accommodation status of at least one of the substrates in the container main body by a detection unit;
   correcting, by a correction device, the accommodation status of the at least one of the substrates in the container main body in which the accommodation status of the at least one of the substrates detected by the detection unit is abnormal;
   putting a substrate transfer device into the container main body in which the accommodation status of the at least one of the substrates is corrected, and unloading the substrate from the container main body,
   determining a number of substrates of which accommodation status is detected to be abnormal; and
   determining whether the correcting of the accommodation status of the at least one of the substrates is performed by using an opening/closing door in order to correct the accommodation status of the at least one of the substrates in a lump or is performed by using the substrate transfer device in order to correct the accommodation status of the at least one of the substrates individually for each of the substrates according to the number of substrates of which accommodation status is detected to be abnormal.

2. The substrate transfer method of Claim 1,
   wherein the correction device is configured to correct at least one of an inclination angle of the at least one of the substrates and a depth position of the at least one of the substrates in the container main body.

3. The substrate transfer method of Claim 1, further comprising:
   holding, by the opening/closing door, the cover body separated from the container main body; and
   moving the cover body held by the opening/closing door back and forth with respect to the substrate unloading opening of the container main body,
   wherein the correction device includes the opening/closing door configured to open and close a transfer opening for the at least one of the substrates in the load port and configured to engage the cover body with the container main body and separate the cover body from the container main body, and
   the correcting of the accommodation status of the at least one of the substrates includes controlling the cover body held by the opening/closing door to push the at least one of the substrates toward an inside of the container main body.

4. The substrate transfer method of Claim 1,
   wherein the correction device includes the substrate transfer device, and
   the correcting of the accommodation status of the at least one of the substrates includes adjusting, by the substrate transfer device, a position of the at least one of the substrates with respect to a supporting member that is provided in the container main body and configured to support the at least one of the substrates.

5. A non-transitory computer-readable storage medium having stored thereon computer-executable instructions that, in response to execution, cause a substrate transfer apparatus to perform a substrate transfer method as claimed in Claim 1.

* * * * *